(12) United States Patent
Wang

(10) Patent No.: US 11,468,702 B1
(45) Date of Patent: Oct. 11, 2022

(54) METHOD AND APPARATUS FOR CAPTURING A FINGERPRINT

(71) Applicant: Japan Display Inc., Tokyo (JP)

(72) Inventor: Xingle Wang, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 0 days.

(21) Appl. No.: 17/462,063

(22) Filed: Aug. 31, 2021

(51) Int. Cl.
| | | |
|---|---|---|
| *G06V 40/13* | (2022.01) | |
| *H03F 3/45* | (2006.01) | |
| *G06V 40/12* | (2022.01) | |
| *G06F 3/044* | (2006.01) | |

(52) U.S. Cl.
CPC ...... *G06V 40/1306* (2022.01); *G06V 40/1365* (2022.01); *H03F 3/45475* (2013.01); *G06F 3/044* (2013.01)

(58) Field of Classification Search
CPC ...................................................... G06F 3/044
See application file for complete search history.

(56) References Cited

U.S. PATENT DOCUMENTS

| | | | | |
|---|---|---|---|---|
| 2017/0116452 A1* | 4/2017 | Wang | ................ | G06V 40/1306 |
| 2018/0144171 A1* | 5/2018 | Liang | ................... | H03M 1/466 |
| 2021/0303815 A1* | 9/2021 | Chung | ............... | G06V 40/1365 |

* cited by examiner

*Primary Examiner* — Joseph R Haley
(74) *Attorney, Agent, or Firm* — Xsensus LLP

(57) ABSTRACT

A fingerprint capturing apparatus includes a plurality of panel capacitors each configured to output an alternating charge signal indicating a capacitance proportional to a proximity of a portion of a subject's finger, a de-serialized amplifier circuit including an operational amplifier that receives the alternating charge signal from the plurality of panel capacitors, and a change in condition control circuit configured to make a change in an operating condition of the de-serialized amplifier based on a voltage of an output of the operational amplifier. The change in condition control circuit also configured to output a count of a number of times of making the change in the operating condition of the de-serialized amplifier. The apparatus also including a processor circuit configured to recognize the subject's fingerprint based on the count of the number of times of making the change in the operating condition of the de-serialized amplifier.

20 Claims, 17 Drawing Sheets

Background Art

METHOD AND APPARATUS FOR CAPTURING A FINGERPRINT

FIELD OF THE INVENTION

The present disclosure relates generally to fingerprint capture, and in particular, to a method and apparatus for storing a detailed representation of a fingerprint of a subject.

BACKGROUND OF INVENTION

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly nor impliedly admitted as prior art against the present invention.

A fingerprint is characterized by the particular locations and patterns of friction ridges on the fingers or toes of a subject. Hereinafter, the term "friction ridges" and "ridges" are used interchangeably, and the terms "finger" or "toe" are used interchangeably. The ridges are portions of skin that are slightly raised higher from the skin base layer as compared to the height of adjacent valleys formed between the ridges.

Traditionally, a fingerprint of a particular subject is captured by applying ink to the ridges, pressing the fingers or toes against a surface, and capturing an image of the resulting ink pattern left on the surface as a detailed image of the fingerprint. Alternatively, a fingerprint may be captured by using a capacitive sensor to measure distances across various portions of the finger or toe from a surface of the capacitive sensor to a corresponding nearest portion of skin, either a top of a ridge or a top of a valley. By plotting the distances measured across a surface of the finger or toe, the pattern of ridges and valleys, and hence the fingerprint, can be captured.

SUMMARY OF INVENTION

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to limitations that solve any or all disadvantages noted in any part of this disclosure.

According to an embodiment of the invention, a fingerprint capturing apparatus includes a plurality of panel capacitors each configured to output an alternating charge signal indicating a capacitance proportional to a proximity of a portion of a subject's finger; a de-serialized amplifier circuit including an operational amplifier that receives the alternating charge signal from the plurality of panel capacitors; a change in condition control circuit configured to make a change in an operating condition of the de-serialized amplifier based on a voltage of an output of the operational amplifier, and output a count of a number of times of making the change in the operating condition of the de-serialized amplifier; and a processor circuit configured to recognize a fingerprint of the subject's finger based on the count of the number of times of making the change in the operating condition of the de-serialized amplifier.

The fingerprint capturing apparatus may be further configured such that the de-serialized amplifier circuit includes a de-serializing switch configured to direct the alternating charge signal to one of an inverting and a non-inverting input of the operational amplifier; and the change in condition control circuit makes the change in the operating condition of the de-serialized amplifier by changing whether the de-serializing switch directs the alternating charge signal to the inverting input or the non-inverting input of the operational amplifier.

The fingerprint capturing apparatus may be further configured such that the de-serialized amplifier circuit includes a charge amplifier circuit including the operational amplifier and an accumulation capacitor connected from an input of the operational amplifier to the output of the operational amplifier; and the change in condition control circuit makes the change in the operating condition of the de-serialized amplifier by changing when a voltage stored on the accumulation capacitor is reset to zero.

The fingerprint capturing apparatus may be further configured such that the change in condition control circuit includes a comparator circuit and a count circuit, the comparator circuit receives an output voltage of the operational amplifier, and the count circuit is configured to increment a stored count based on an output of the comparator circuit and output the stored count as the count of the number of times of making the change in the operating condition of the de-serialized amplifier circuit.

The fingerprint capturing apparatus may be further configured to include a fine analog-to-digital circuit configured to output a number corresponding to a detected residual of the voltage of the output of the operational amplifier, and the processor circuit is further configured to recognize the fingerprint of the subject's finger based on the number corresponding to the detected residual of the voltage of the output of the operational amplifier.

The fingerprint capturing apparatus may be further configured such that the fine analog-to-digital circuit includes a conditioning circuit that receives the output of the operational amplifier and outputs a differentially conditioned signal; and the fine analog-to-digital circuit further includes an analog-to-digital converter configured to convert the differentially conditioned signal to the number corresponding to the detected residual voltage of the output of the operational amplifier.

The fingerprint capturing apparatus may be further configured such that the processor circuit is further configured to concatenate the number corresponding to the detected residual of the voltage of the output of the operational amplifier, as a least significant part of a measurement of an accumulated voltage corresponding to the proximity of the portion of the subject's finger, and the number of times of making the change in the operating condition of the de-serialized amplifier, as a most significant part of the measurement of the accumulated voltage corresponding to the proximity of the portion of the subject's finger; and the processor circuit is further configured to recognize the fingerprint of the subject's finger based on the measurement of the accumulated voltage corresponding to the proximity of the portion of the subject's finger.

The fingerprint capturing apparatus may be further configured such that the change in condition control circuit is configured to make the change in the operating condition of the de-serialized amplifier to maintain the voltage of the output of the operational amplifier within a linear range of the de-serialized amplifier circuit.

The fingerprint capturing apparatus may be further configured such that the de-serialized amplifier circuit includes a de-serializing switch configured to direct the alternating charge signal to one of an inverting and a non-inverting input of the operational amplifier, a first accumulation capacitor connected from the inverting input of the operational amplifier to a non-inverting output of the operational amplifier, and a second accumulation capacitor connected from the non-inverting input of the operational amplifier to an inverting output of the operational amplifier; and the change in condition control circuit makes the change in the operating condition of the de-serialized amplifier by changing whether the de-serializing switch directs the received alternating voltage to the inverting input or the non-inverting input of the operational amplifier.

The fingerprint capturing apparatus may be further configured such that the change in condition control circuit includes a comparator having a first input connected to the output of the operational amplifier; and the change in condition control circuit further includes a switch and count logic that increments the count of the number of times of making the change in the operating condition of the de-serialized amplifier based on an output of the comparator.

The fingerprint capturing apparatus may be further configured such that the comparator has a second input connected to a fixed max linear region reference voltage; and the output of the comparator becomes active when a voltage at the first input of the comparator is greater than a voltage at the second input of the comparator.

The fingerprint capturing apparatus may be further configured such that the change in condition control circuit further includes a reference logic switch configured to connect a second input of the comparator to one of a fixed max linear region reference voltage and a fixed min linear region reference voltage; and the change in condition control circuit is further configured to change a position of the reference logic switch when making the change in the operating condition of the de-serialized amplifier.

The fingerprint capturing apparatus may be further configured such that the processor circuit is further configured to obtain a digitized image of the fingerprint of the subject's finger based on the count of the number of times of making the change in the operating condition of the de-serialized amplifier for each of the plurality of panel capacitors.

An embodiment of the invention may include a fingerprint capturing apparatus including a plurality of panel capacitors each configured to output an alternating charge signal indicating a capacitance proportional to a proximity of a portion of a subject's finger; a de-serialized amplifier circuit including an operational amplifier that receives the alternating charge signal from the plurality of panel capacitors; means for making a change in an operating condition of the de-serialized amplifier based on a voltage of an output of the operational amplifier, and outputting a count of a number of times of making the change in the operating condition of the de-serialized amplifier; and a processor circuit configured to recognize a fingerprint of the subject's finger based on the count of the number of times of making the change in the operating condition of the de-serialized amplifier.

An embodiment of the invention may include a method of capturing a fingerprint including outputting, from a plurality of panel capacitors, an alternating charge signal indicating a capacitance proportional to a proximity of a portion of a subject's finger; receiving, by a de-serialized amplifier circuit including an operational amplifier, the alternating charge signal; making a change in an operating condition of the de-serialized amplifier based on a voltage of an output of the operational amplifier; outputting a count of a number of times of making the change in the operating condition of the de-serialized amplifier; and recognizing a fingerprint of the subject's finger based on the count of the number of times of making the change in the operating condition of the de-serialized amplifier.

The method of capturing the fingerprint may include directing the alternating charge signal to one of an inverting and a non-inverting input of the operational amplifier; and the making the change in the operating condition of the de-serialized amplifier by changing whether the directing is directing the alternating charge signal to the inverting input or the non-inverting input of the operational amplifier.

The method of capturing the fingerprint may include making the change in the operating condition of the de-serialized amplifier by changing when a voltage stored on an accumulation capacitor connected from an input to an output of an operational amplifier in the de-serialized amplifier is reset to zero.

The method of capturing the fingerprint may include incrementing a stored count when an output voltage of the operational amplifier reaches a threshold voltage; and outputting the stored count as the count of the number of times of making the change in the operating condition of the de-serialized amplifier circuit.

The method of capturing the fingerprint may include outputting a number corresponding to a detected residual of the voltage of the output of the operational amplifier; and recognizing the fingerprint of the subject's finger based on the number corresponding to the detected residual of the voltage of the output of the operational amplifier.

The method of capturing the fingerprint may include making the change in the operating condition of the de-serialized amplifier to maintain the voltage of the output of the operational amplifier within a linear range of the de-serialized amplifier circuit.

BRIEF DESCRIPTION OF THE DRAWINGS

The scope of the present disclosure is best understood from the following detailed description of exemplary embodiments when read in conjunction with the accompanying drawings, wherein.

Further areas of applicability of the present disclosure will become apparent from the detailed description provided hereinafter. It should be understood that the detailed description of exemplary embodiments is intended for illustration purposes only and are, therefore, not intended to necessarily limit the scope of the disclosure.

DETAILED DESCRIPTION

Figure 1A:
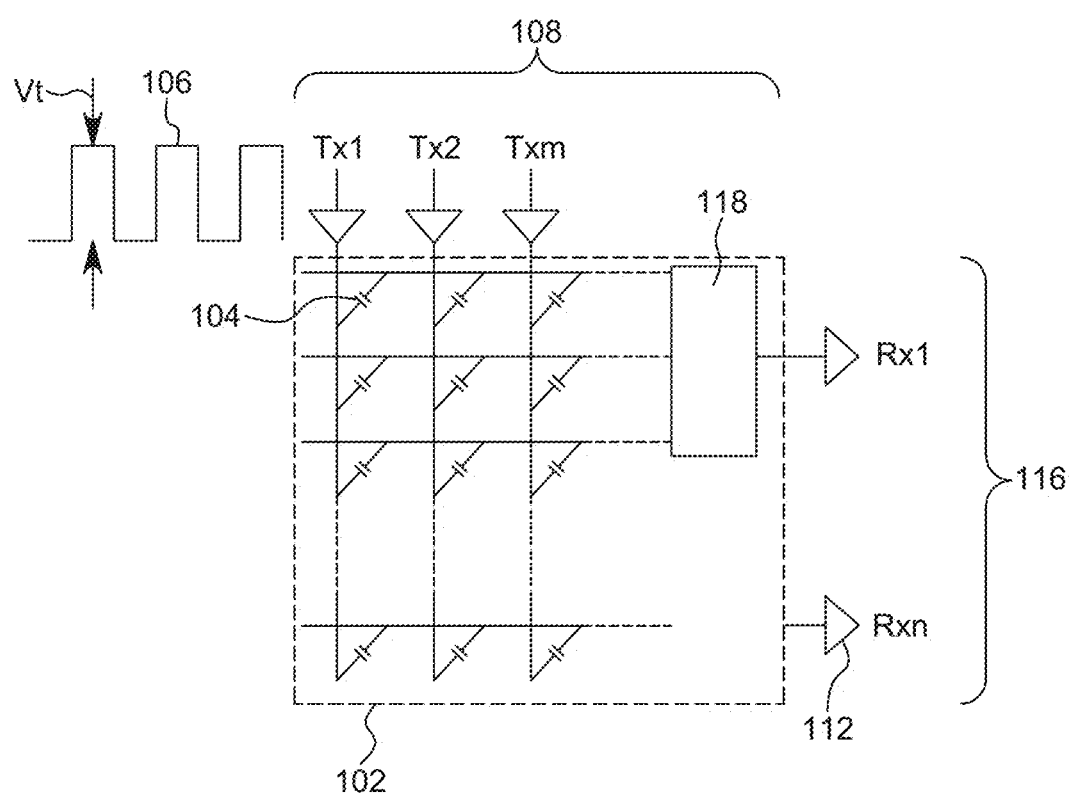
FIG. 1A is a block diagram of a portion of a comparative fingerprint capture apparatus.
Figure 1B:
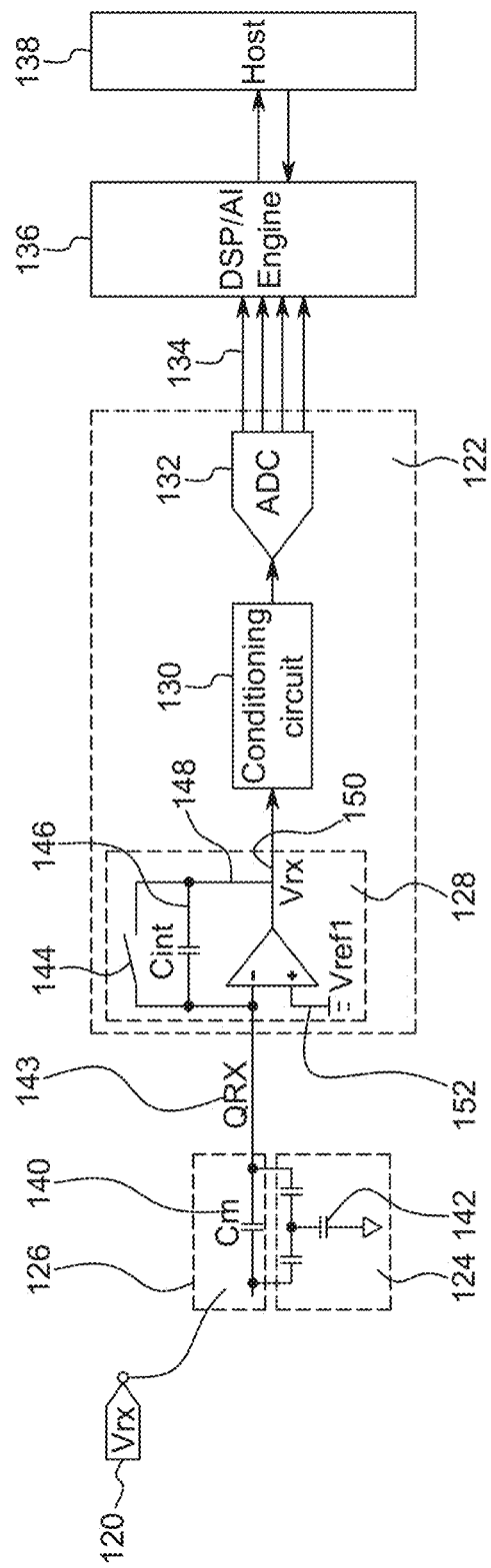
FIG. 1B is a block diagram of another portion of the comparative fingerprint capture apparatus.

FIGS. 1A and 1B show a comparative fingerprint capture apparatus that includes a panel 102 having an array of capacitive sensors 104 connected in each column to a corresponding driver/amplifier 110 that drives the column with a corresponding transmit signal TX1 . . . TXM 108 having alternating waveforms 106 with amplitude Vt. The comparative fingerprint apparatus is shown to highlight certain aspects of the inventive embodiments and does not constitute admitted prior art. Each row of capacitive sensors 104 is connected to a corresponding receiver 112 to produce a channel receive signal RX1 . . . RXN 116. If a subject's finger is arranged near the panel 102, the amount of capacitance appearing on each capacitive sensor 104 is proportional to a distance (i.e., a proximity) from the panel 102 to a nearest portion of skin at the corresponding location.

The panel 102 may be part of a display panel in a visual display, such as the display of a mobile device. Alternatively, the panel 102 may be part of a touch sensing panel on a surface of a visual display, such as a touch sensing panel on a display of a mobile device. Further alternatively, the panel 102 may be part of another portion of a device having another function, or may be a dedicated fingerprint detecting panel having only a finger print detecting function.

When detecting a fingerprint, each capacitive sensor 104 (aka, sensor front) at receive channels RX1 . . . RXN 116 may be modeled as an equivalent capacitance made up of a mutual capacitance 126 and a finger and body capacitance model 124. The mutual capacitance 126 is modeled by a single capacitor Cm 140 which corresponds to distance measured at the corresponding location of the finger. The finger and body model includes an arrangement of capacitors 142 representing the inherent capacitance of the subject's finger (or toe) and body.

According to this comparative example, an AFE (Analog Front End) contains multiple receive channels RX1 . . . RXN, each sensing a portion of the fingerprint and inputs those to a charge amplifier CA 128. Each of RX1 . . . RXN (receive channel 122) may receive the inputs multiplexed by multiplexer 118 from a subset of rows in the panel 102 (e.g., three rows may be multiplexed to a single RX channel). In general, each TX or a group of TXs is driving the panel sequentially; all receive channels RX1 . . . RXN then read out the data in parallel. This TX-sequential-RX-parallel paradigm makes the most efficient use of the AFE. Of the receive channel 122, the charge amplifier CA 128 includes an operational amplifier 148 having a non-inverting input connected to a predetermined fixed reference voltage Vref1 152. An inverting input of the operational amplifier 148 receives the signal from the corresponding mutual capacitance 126. Connected between the inverting input and an output of the operational amplifier 148 are a feedback capacitor Cint 146 and a reset switch 144. The reset switch is controlled by a control circuit (not shown) to reset (zero) the voltage in the capacitor Cint 146. The switch is reset after every charge pulse of TX.

A conditioning circuit 130 receives the output of the charge amplifier CA 128 and may include various circuits (e.g., one or more of a band pass filter, mixer, low pass filter, or other circuits) to amplify and condition the output voltage of the charge amplifier CA 128.

The output of the conditioning circuit 130 is sampled by an analog-to-digital converter ADC 132. The sampled output of the ADC 132 is provided to a Digital Signal Processor (DSP)/Artificial Intelligence (AI) Engine 136 that collects and recognizes the detected distances as a subject's fingerprint. The captured fingerprint may be used by a connected system that may also coordinate the operation of the fingerprint capture apparatus 122, such as host 138.

The inventors have recognized that a problem in detecting fingerprints using the comparative system pertains to the very small capacitive difference between ridges and valleys, called the Finger Print Signal (FPS), which may be as small as 0.5 attofarads (aF) or smaller, while other components of the sensed signal are much larger. Thus, a very large dynamic range is encountered when trying to detect the FPS. For example, a baseline signal (including the sensed capacitance of the subject's finger and body) superimposed on the FPS may be on the order of 1-10 femtofarads (fF) or about 65 DB greater than the FPS signal, an unremoved data path offset (including effects from the panel and circuitry) superimposed on the FPS is about 66-70 dB greater than the FPS, and some bandlimited noise sources, like charger noise which may also be superimposed on the FPS, are estimated to be about 133 dB greater than the FPS. Some conventional fingerprint capture methods seek to separately digitize and subtract out the bandwidth limited noise for later analysis and removal.

Figure 2:
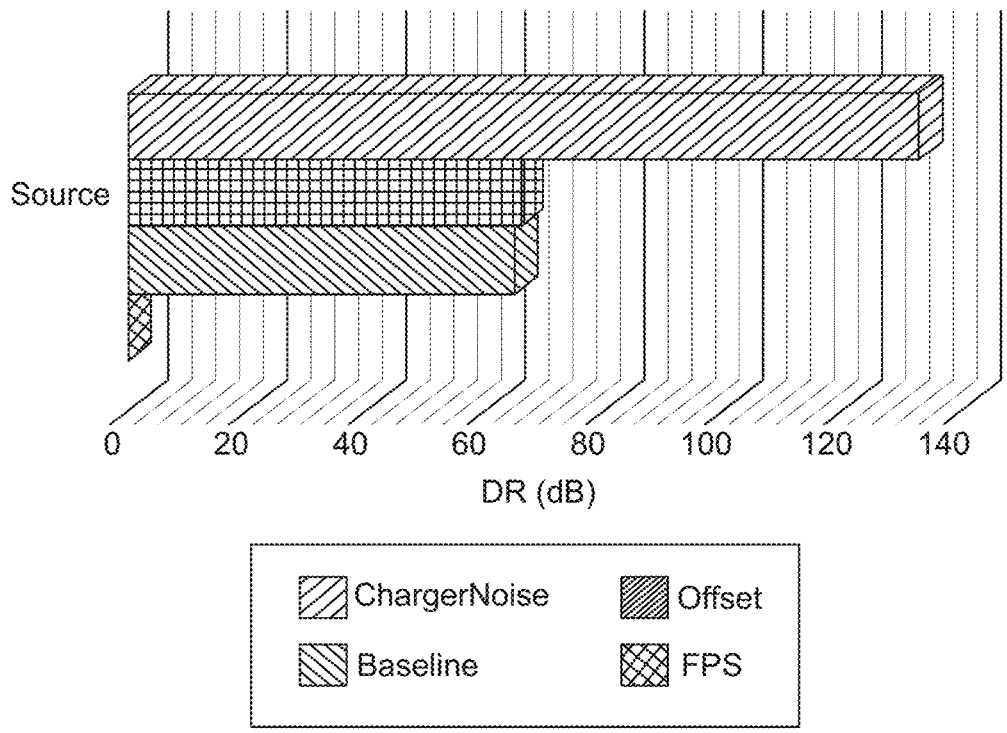
FIG. 2 illustrates amplitudes of FPS and other signal components considered by a fingerprint capture apparatus.

FIG. 2 illustrates the contrast of amplitudes of FPS and other signal components considered by a fingerprint capture apparatus.

Figure 3:
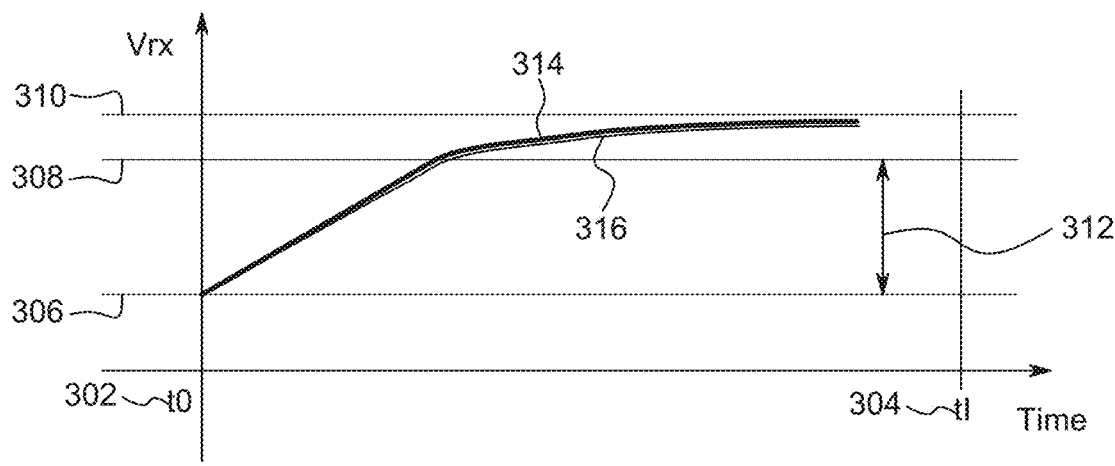
FIG. 3 illustrates an integration process in a comparative fingerprint capture apparatus.

FIG. 3 illustrates the integration process in the comparative fingerprint capture apparatus in FIG. 1. The output voltage of the integration process, Vrx, starts at time t0 302 and at a pre-defined level Vref1 306 (i.e., a fixed min linear range reference voltage). Depending on the supply voltage there exists a level Vref2 308 (i.e., a fixed max linear range reference voltage) beyond which the output of the integration process quickly goes into the saturation region which is between level 308 and level 310. The linear region 312 depicts the only viable work range of the integration process. When traversing the linear region 312, the ridge integration voltage curve 314 and the valley integration voltage curve 316 gradually splits due their capacitance difference. However, because the linear region 312 is limited, and because of the large dynamic range of signal Vrx, FPS, being a very small component of Vrx, can be very difficult to extract after the one time traverse of the linear region 312. In FIG. 3 the integration time ends at time tI 304. Extending time tI 304 to a later time does not help because FPS magnitude has become saturated too once the integration curves enter the saturation region.

Figure 4:
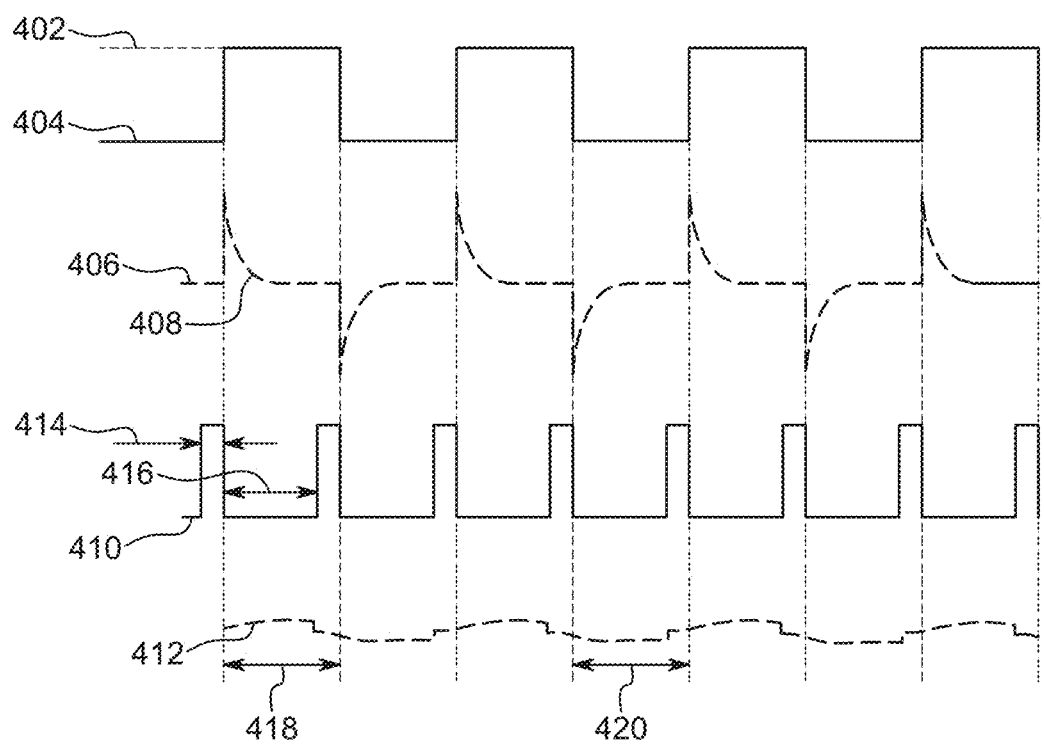
FIG. 4 illustrates signal timing in a comparative fingerprint capture apparatus.

FIG. 4 shows signals and their timing relations during a method of operating the comparative fingerprint capture apparatus of FIG. 1. TX/Qrx pulse waveform 404 having a maximum voltage of Vt 402 is supplied to each column of capacitive sensors 104. The waveform 406 of received charge signal Qrx 143 at the input to the CA 128 includes a series of positive and negative going pulses 408 corresponding to the sensed capacitance value at one corresponding capacitive sensor 104. The reset switch 144 is operated to clear/reset the voltage on Cint 146 near the beginning and the end of each TX pulse 404 at reset time 414 resulting in an integration time of 416 during which charge is accumulated on Cint 146. Thus, for each Qrx pulse, the CA first resets and then integrates the detected charge onto Cint, generating a Vrx pulse waveform 412 at the output of the charge amplifier 128. The signal Vrx 150 has reset and integrate periods 418 during which the odd pulses (i.e., during positive going half-cycle of TX) can be integrated and reset, and integrate periods 420 during which even pulses can be integrated and reset.

The duration of each of the reset and integrate periods 418 and 420 is the same as the duration of each Qrx pulse 404. Pulse 410 represents a time during which the voltage on the accumulation capacitor Cint 146 is set to zero. A single Qrx pulse is extremely small. For example, using a 12V transmitter (i.e., Vt=12V), a 0.5 aF FPS is equivalent to only 37.45 electrons. Detection of this amplitude of FPS is difficult according to conventional approaches, especially when the application imposes power and/or size limitations. On the other hand, operating to collect multiple Qrx pulses (i.e., making the reset and integrate periods across Qrx pulse boundaries) can possibly enhance FPS. However due to the saturation mechanism in FIG. 3. It is hardly possible. The collection of multiple Qrx pulses to enhance FPS can alternatively be done in the digital domain like the DSP/AI engine 136 (i.e., after each Vrx is digitized by the ADC). However, shifting to digital centric processing does not ease the large dynamic range problem of FPS extraction; plus, high power and large size analog circuits are still required to handle the large dynamic range.

Figure 5A:
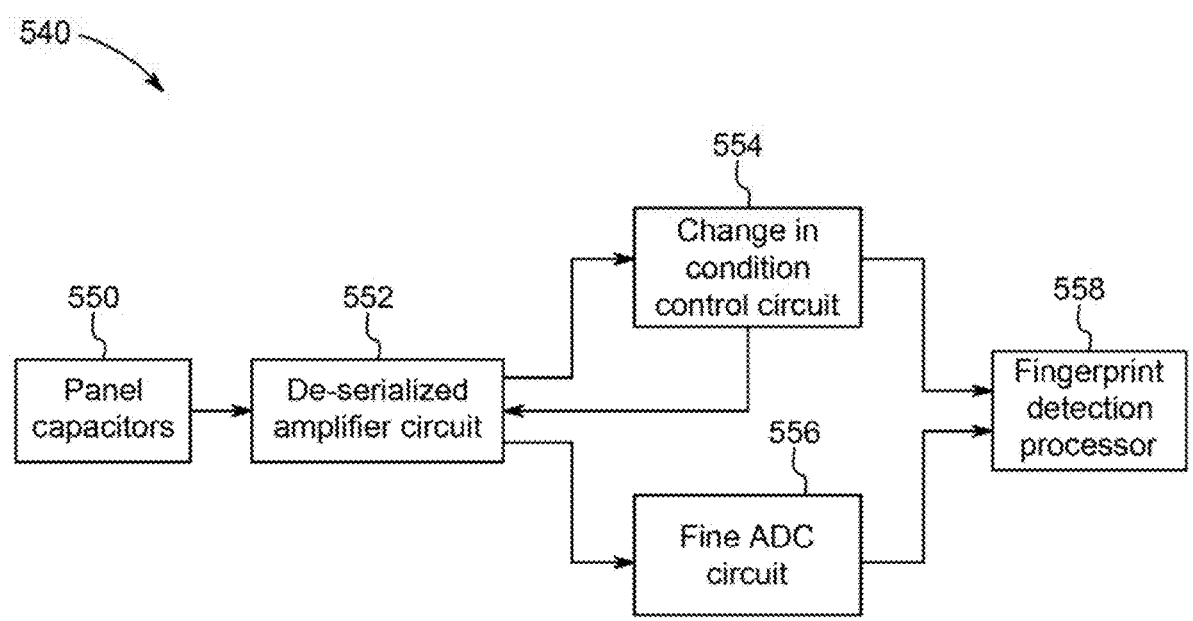
FIG. 5A illustrates an embodiment of a fingerprint capture apparatus according to an embodiment of the invention.

FIG. 5A shows components of a fingerprint capture apparatus 540 according to an embodiment of the invention and including panel capacitors 550, a de-serialized amplifier circuit 552, a change in condition control circuit 554, a fine ADC circuit 556, and a fingerprint detection processor 558. The de-serialized amplifier circuit 552 includes at least an operational amplifier that receive an alternating charge signal from the panel capacitors 550. The de-serialized amplifier circuit 552 may correspond to the charge amplifier circuit (504, 904, 1204) in each of the following embodiments, or a combination of the charge amplifier circuit and the de-serializer circuit (502, 902, 1202) in each of the following embodiments. The change in condition control circuit 554 is configured to make a change in an operating condition of the de-serialized amplifier based on a voltage of an output of the operational amplifier in the de-serialized amplifier circuit 552. The change in condition control circuit 554 may be implemented as the MSB evaluator (506, 906, and/or 1206) in each of the embodiments discussed below.

Examples of how the change in condition control circuit 554 may make the change in the operating condition of the de-serialized amplifier circuit 552 are discussed further with respect to the more detailed views of the embodiments of the invention discussed below. For example, the change in condition control circuit 554 may make the change in the operating condition of the de-serialized amplifier circuit 552 by varying or changing a position of a switch in the de-serialized amplifier circuit 552 to differently direct a signal or change the timing of a signal or an operation, as discussed below. The change in condition control circuit 554 is further configured to output a count of a number of times of making the change in the operating condition of the de-serialized amplifier circuit 552. The fine ADC circuit 556 is configured to output a number corresponding to a detected residual of the voltage of the output of the operational amplifier in the de-serialized amplifier circuit 552. The fingerprint detection processor 558 is configured to recognize the fingerprint of the subject's finger placed in proximity to the panel capacitors 550 based on the count of the number of times of making the change in the operating condition output by the change in condition control circuit 554, which corresponds to a most significant portion of a detected value, and the number corresponding to the detected residual of the voltage of the output of the operational amplifier in the de-serialized amplifier circuit 552 that is output by the fine ADC circuit 556.

Figure 5B:
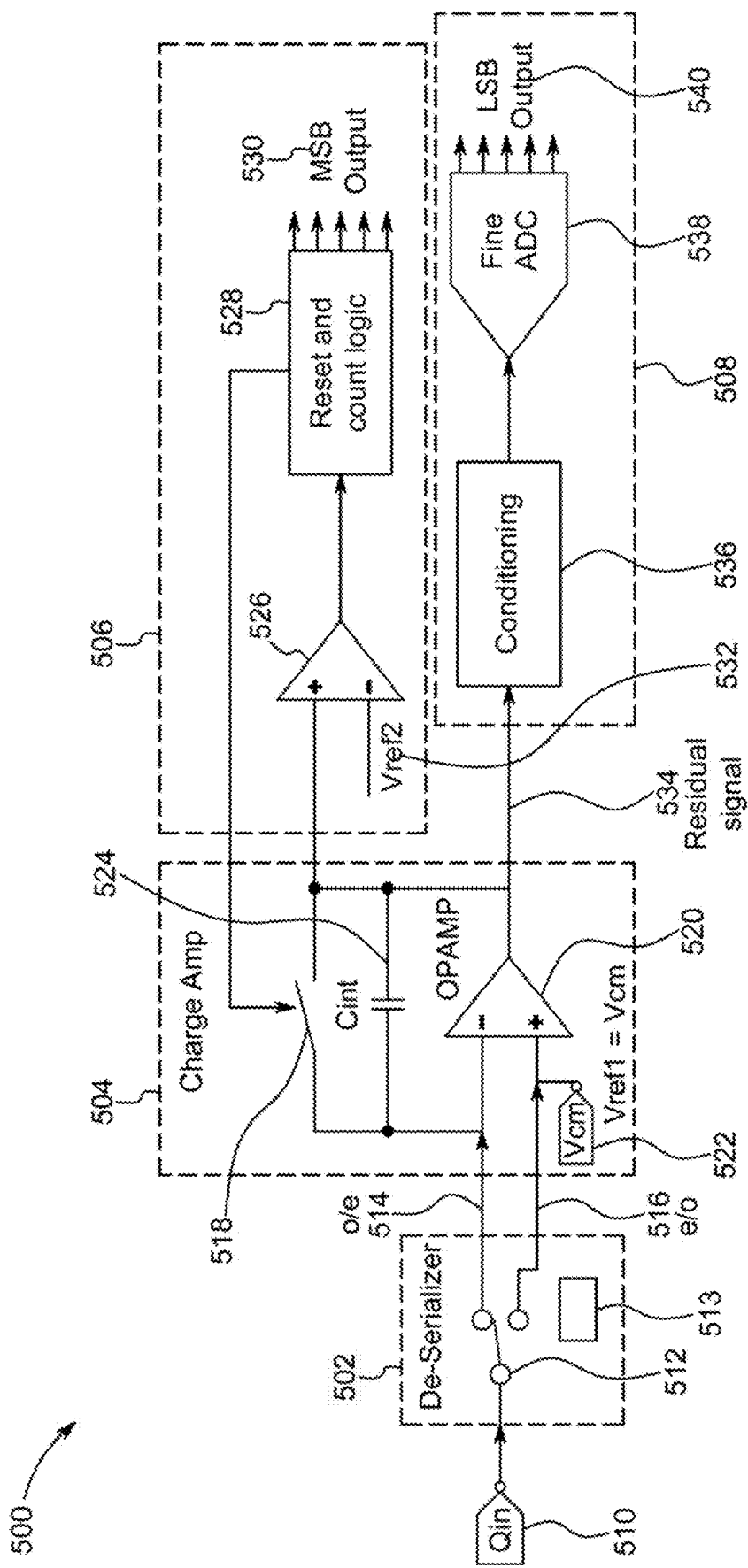
FIG. 5B illustrates an alternative view of the embodiment of the fingerprint capture apparatus.

FIG. 5B shows a fingerprint capture apparatus 500 according to an embodiment of the invention and including a de-serializer 502, charge amplifier 504, most significant bits (MSB) evaluator 506, and least significant bits (LSB) evaluator 508. The de-serializer 502 includes a switching device 512 to route receive input charge signal Qin 510 from panel capacitors 550 to one of two outputs o/e 514 and e/o 516 depending on whether a positive charge signal or negative charge signal is being received. De-serializer switching device 512 is controlled by control circuit 513 to switch to a different output on each half-cycle of the received Qin alternating charge signal. Although control circuit 513 is depicted as being part of the serializer 502, the control circuit 513 may alternatively be part of a different circuit. The de-serializer 502 operates to separate the incoming bi-polar pulse stream into two unipolar pulse streams, namely up- and down-pulses (aka, odd- and even-pulses). One of the pulse streams o/e 514 is then repeatedly deposited onto the integration capacitor of the charge amplifier.

The charge amplifier 504 includes an operational amplifier 520 having inverting input that receives the output stream o/e 514 and a non-inverting input that is biased to a fixed common-mode voltage Vcm 522 which is also connected to the second switch output stream e/o 516. The common-mode voltage 514 defines the virtual ground or reset level for the charge amplifier, as well as acts as a sink for the de-serializer output stream e/o. When the de-serializer switch 512 directs Qin 510 to the non-inverting input, the charge Qin is simply dumped to the voltage Vcm. Because each of the de-serializer output stream e/o and o/e maintains a fixed polarity, this arrangement ensures that only the charge pulses of the same polarity are to be integrated by the charge amplifier. An integration capacitor Cint 524 and a reset switch 518 are each connected between the inverting input and the output of the operational amplifier 520. The operational timing of the reset switch 518 is different than in the comparative apparatus of FIG. 1, as further explained below.

The charge amplifier 504 output, accumulated signal 534, is provided to each of the MSB evaluator 506 and LSB evaluator 508. In the MSB evaluator 506, the accumulated signal 534 is provided to the non-inverting input of a comparator 526, and the inverting input of the comparator 526 is set to a predetermined, fixed reference voltage Vref2 532. The output of the comparator is provided to reset and count logic 528 which counts the number of times that the accumulated signal 534 exceeds Vref2, and activates the reset switch 518 each time. The reset and count logic 528 outputs the counted number of times as MSB output 530.

The LSB evaluator 508 includes conditioning circuit 536 including amplifiers and filters to detect and process small variations in the accumulated signal 534 and output the detected signal as a matched signal to the Fine ADC 538 which performs analog-to-digital conversion and outputs, at the appropriate timing, the LSB output 540. The LSB output 540 is read by a higher level device and used for fingerprint recognition at a time after the MSB output 530 has finished counting the number of operational changes in the charge amplifier (i.e., after each time the charge amplifier reaches threshold Vref2). The timing of when the LSB output 540 and MSB output 530 are read is determined by the higher level function, at a time that meets system level requirements of timing allocated for reading a single sensor value. The total output of the fingerprint capture apparatus 500 is a concatenation of MSB output 530 representing the most significant digits of the output, and LSB output 540 representing the least significant digits of the output. The concatenated value is then provided to a DSP/AI Engine 136 and Host 138 (which collectively correspond to the fingerprint detection processor 558) as in the comparative apparatus of FIG. 1. In the example of FIG. 5B, the de-serializer 502 and charge amp 504 correspond to the de-serialized amplifier 552, the MSB evaluator 506 corresponds to the change in condition control circuit 554, and the LSB evaluator 508 corresponds to the fine ADC circuit 556. This process results in a digitized image of the fingerprint of the subject's finger with concatenated values of the LSB output 540 and MSB output 530 corresponding to a proximity of a portion of the subject's finger at each different sensor location.

Figure 6:
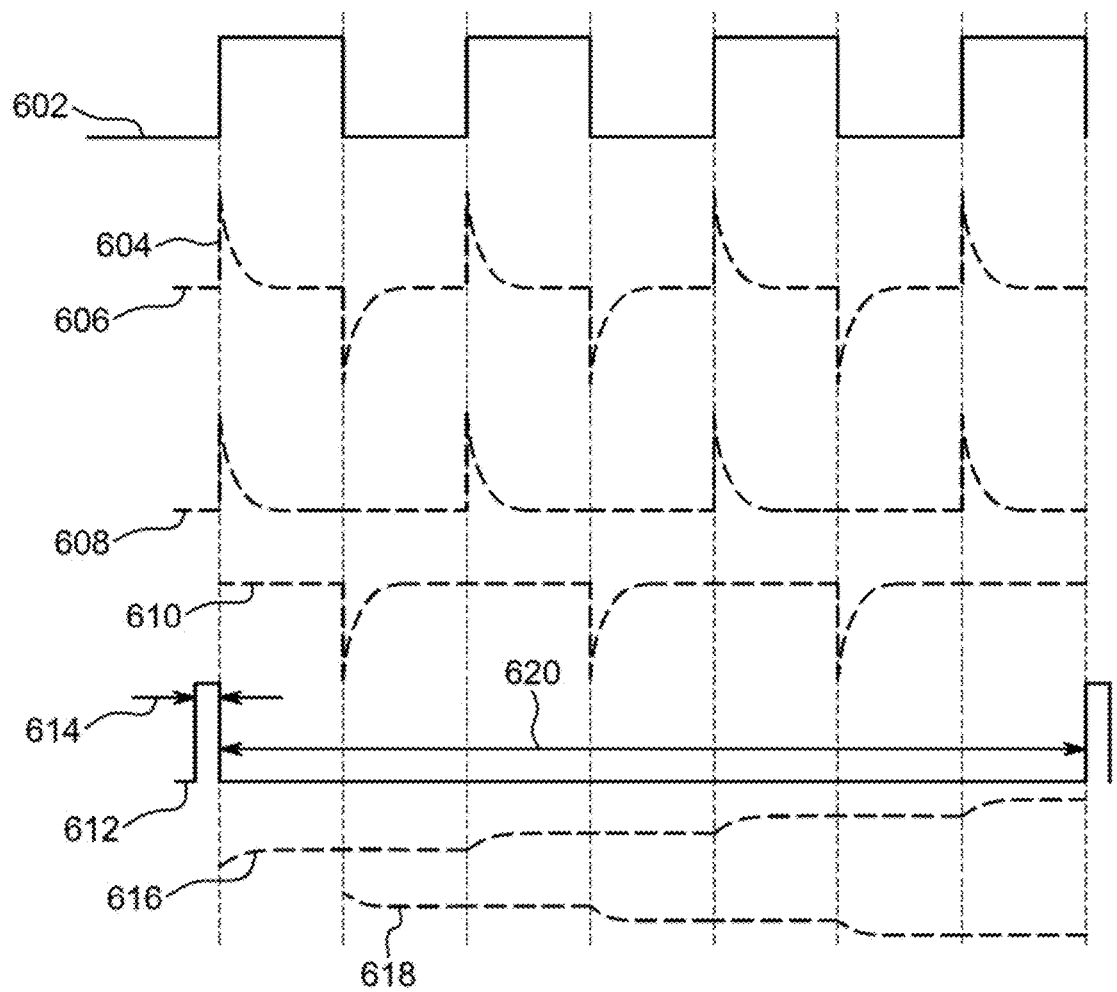
FIG. 6 shows timing of signals according to a method of operating the embodiment of the fingerprint capture apparatus.

FIG. 6 shows the timing of signals according to a method of operating the fingerprint capture apparatus 500. TX signal 602 is provided to a capacitive sensor panel 102, and Qrx signal 606 from the panel 102 and including a series of positive and negative going pulses 604 is received by the de-serializer 502. The de-serializer 502 switches on each half-cycle of the receive signal Qrx to produce two output signals: odd pulses 608 and even pulses 610. During multiple cycles of the received Qrx waveform (corresponding to multiple cycles of TX) the received charge value from the Qrx signal is accumulated by the charge amp 504 on the capacitor Cint 524.

According to this embodiment, the switch 518 does not reset the accumulated charge on each half-cycle of TX or Qrx as in the comparative apparatus of FIG. 1. Instead, the reset switch 518 is only operated to clear/zero the charge stored in the capacitor Cint 524 at reset time 614 when the MSB evaluator 506 signals that the accumulated charge has reached a threshold set by Vref2 and that the fact of that accumulation has been counted. In the example of FIG. 6, the integration time 620 shows approximately 7 half-cycles of TX/Qrx. In fact, the integration time 620 can be much longer, reaching tens or even hundreds of Tx periods. The integration time 620 is not necessarily an exact multiple of Tx periods as shown in this example, and the integration time 620 may end during some portion of a Tx period.

Figure 7A:
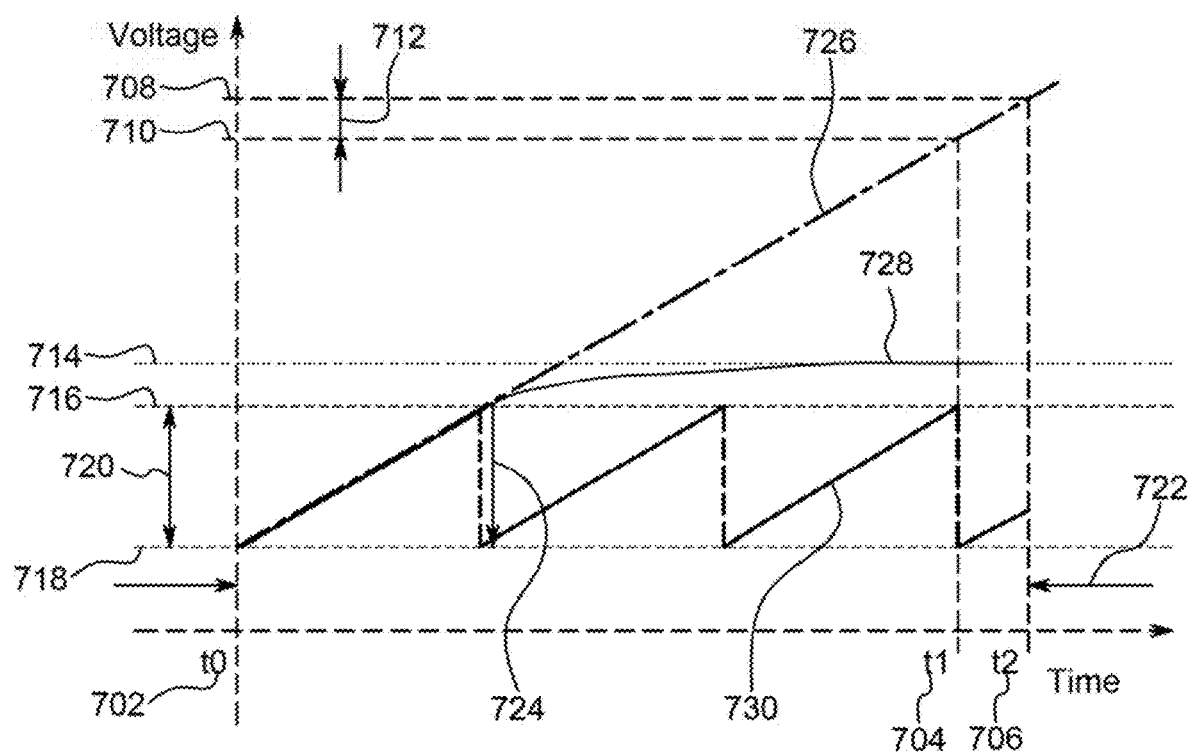
FIG. 7A shows timing of signals according to a method of operating the embodiment of the fingerprint capture apparatus.

FIG. 7A shows a novel way of illustrating the operation of the embodiment in FIG. 5B, also referred to as the integrate-reset-delta embodiment, as discussed below. According to the embodiment of FIG. 5B, the integrated voltage is confined in the linear range 720 between Vref1 718 and Vref2 716, which is lower than the saturation voltage Vsat 714. In this case, "linear range of a circuit" refers to an operating range for which the output of the circuit is maintained to have a linear (i.e., directly proportional) relationship to the inputs of the circuit. For example, in one embodiment, the linear range 720 refers to the range of output voltages of the charge amplifier 504 that correspond to a linear operating range of the charge amplifier 504, and in particular, the operating range of the charge amplifier 504 within which there is a linear relationship between the input voltage to the charge amplifier 504 and the output voltage of the charge amplifier 504. In other embodiments, the linear range 720 may alternative correspond to the linear operating range of the operational amplifier 520, the linear operating range of the de-serializer 502 plus the charge amplifier 504, or the linear operating range of the entire fingerprint capture apparatus, for example as shown in FIG. 5A, including panel capacitors 550, de-serialized amplifier circuit 552, change in condition control circuit 554, fine ADC circuit 556, and fingerprint detection processor 558. Although an ideal integration line 726 would continue to increase outside of the linear range 720, that is impractical due to the limited voltage supply level which is reflected in Vsat 714. Instead, according to the embodiment of apparatus 500 the integrated voltage on Cint 524 (represented by "integration-reset-delta" curve 730) is reset 724 and counted by the MSB evaluator 508 each time the integrated voltage reaches Vref2 716. For a pre-defined integration time 722, at the end time t2 706, the final digital output is represented by the number of counted resets, as the MSB bits, plus the digitized residual voltage 712 accumulated from the time of the last counted reset time t1 704 until the end of integration time t2 706. The total integration time is selected such that FPS by this integration time should have developed into a signal that is recognizable by a later conditional stage and the fine ADC. The total integration time is also constrained by system timing requirements, such as frame rate.

Figure 7B:
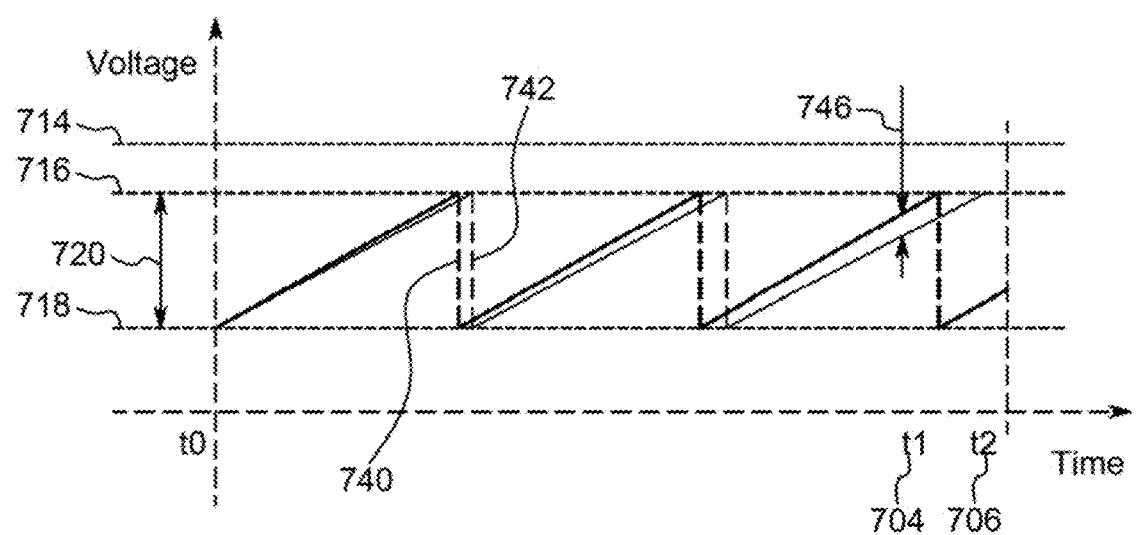
FIG. 7B shows timing of signals according to a method of operating the embodiment of the fingerprint capture apparatus.

FIG. 7B illustrates how the effective signal dynamic range is advantageously reduced by the embodiment of apparatus 500 as compared with the comparative apparatus of FIG. 1. The FPS signal 746, being the difference between the fingerprint valley signal 740 and fingerprint ridge signal 742 continues to grow or accumulate across multiple signal resets 724, while both the valley signal 740 and the ridge signal 742 are confined between the linear range 720. Thus, the effective signal dynamic range is reduced. Starting with a dynamic range of 65 dB (e.g., when considering only baseline and FPS) this example ends up with a reduced dynamic range of 48.3 dB according to the following calculations.

If we adopt the following parameter names:
$C_{m,\Delta}$: Fingerprint capacitance ridge-valley difference
$C_{int}$: Charge Amplifier integrate capacitance
$F_{tx}$: Transmitter frequency
$V_{tx}$: Transmitter signal amplitude
$V_{fps}(t)$: FPS signal generated by the charge amplifier as a function of time
$V_{TH}$: FPS threshold signal level as passed to and recognizable by the downstream stages
Vfps(t) can be determined as follows:

$$V_{fps}(t) = \frac{V_{tx} \cdot C_{m,\Delta} \cdot F_{tx} \cdot t}{C_{int}}, \quad \text{(eq 1)}$$

assuming only either up- or down-pulses are to be integrated, which is consistent with the embodiment in apparatus 500 that uses only one of the output pulse streams from the de-serializer.

Then, to achieve the threshold value $V_{TH}$, the required integration time T is $$T = \frac{V_{TH} \cdot C_{int}}{V_{tx} \cdot C_{m,\Delta} \cdot F_{tx}} \quad \text{(eq 2)}$$

For example, for a 10V transmitter operating at 500 KHz, with an integrate capacitance Cint of 10 pF and a ridge-value typical different of 1 aF, to reach 1 mV desired value requires integration time of 2 ms.

Alternatively, if both up- and down-pulses are used, as in the embodiment of apparatus 1200 the required time to reach 1 mV FPS signal is reduced to 1 ms. Furthermore, if Cint is 2 pF instead of 10 pF, the integration time T to reach 1 mV is reduced to 200 us. The desired $V_{TH}$ is selected as the threshold for which FPS is recognizable by the downstream stages (i.e., conditioning circuit and fine ADC).

After FPS reaches $V_{TH}$ the final dynamic range in the residual signal can be estimated by this equation:

$$DR = 20 \log \left( \frac{V_{ref2} - V_{ref1}}{\sqrt{3} \cdot V_{TH}} \right) \quad \text{(eq 3)}$$

According to the embodiment of apparatus 500, using a 1.5V power supply where $V_{ref1}$=0.75V and $V_{ref2}$=1.2 V, for example, the residual dynamic range is advantageously only 48.3 dB. Even when only baseline is considered, the effective dynamic range reduction is appreciable. The reduction of the effective dynamic range can be attributed to the fact that, some portion of the signal has already been transformed into MSB representation and subtracted from the original signal.

As compared with the comparative apparatus in FIG. 1, the embodiment of apparatus 500 advantageously: reduces complexity of hardware and system design, enables low-pass filtering of the noise embedded in the incoming charge signal, reducing the amount of noise entering the downstream stages and the digital engine, provides for separation of the coarse and the fine ADCs, and relaxes tradeoffs between the SNR (signal-to-noise ratio), circuit size and power consumption of the ADC. Further, since CA output is confined between Vref1 and Vref2, those two voltage levels can be chosen such that the circuits work in the optimal voltage range (usually mid-rail between power supply and the ground). Also, the digital engine can treat MSB and LSM data differently (e.g., using different post-processing algorithms). This means more flexibility in FPS recognition and extraction process.

Figure 8:
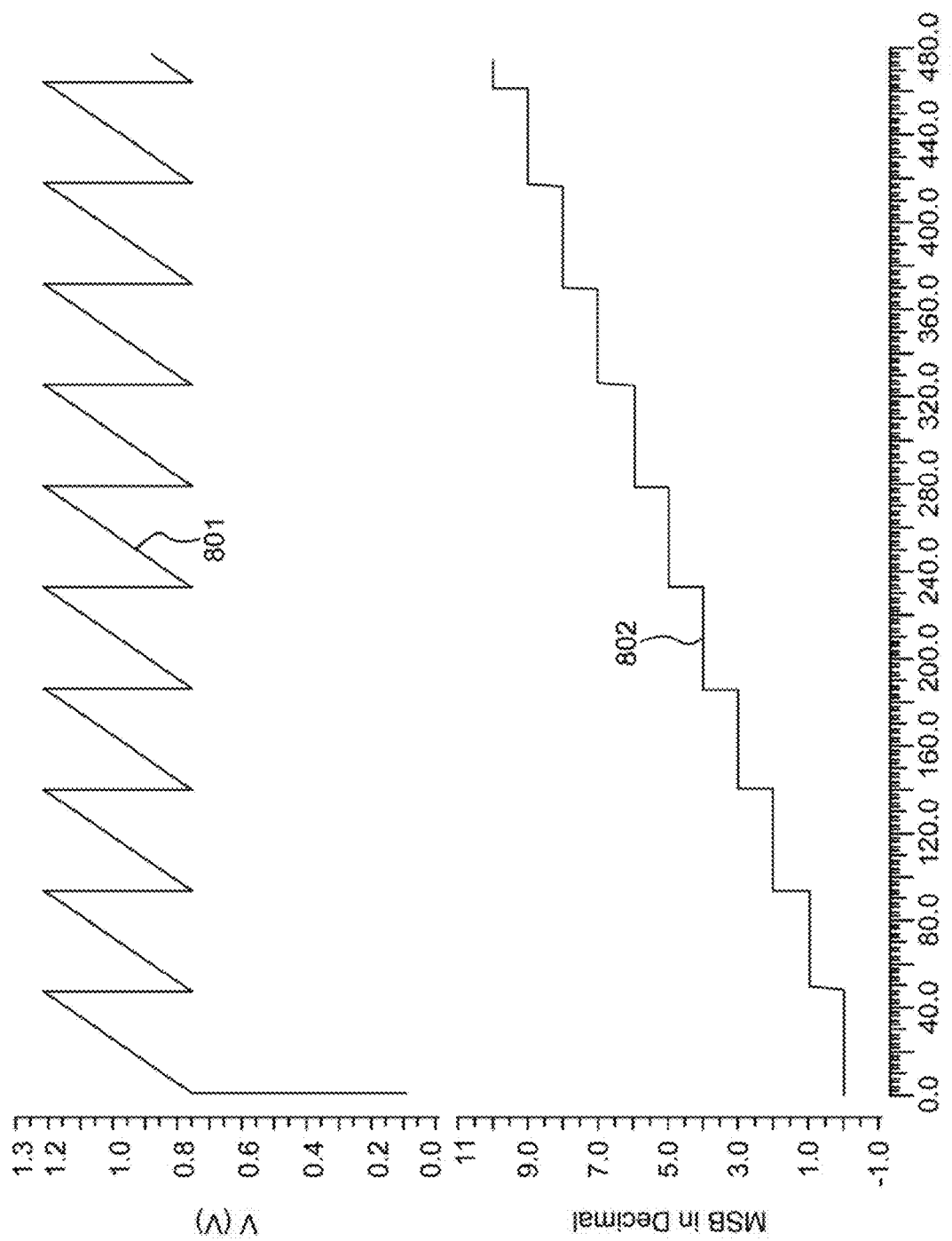
FIG. 8 shows timing of signals according to a method of operating the embodiment of the fingerprint capture apparatus.

FIG. 8 shows an example of operation of the embodiment of apparatus 500 in FIG. 5, in which the MSB read 802 increases with the counts of the reset times of the CA output voltage 801 which integrates from Vref1=0.75 V to Vref2=1.2 V and then reset to Vref1. The integration capacitor Cint is 5 pF, and the driver pulse level Vtx=12 V. Only the first 10 counts of CA output voltage 801 reset times are shown in MSB read 802 in this example.

Figure 9:
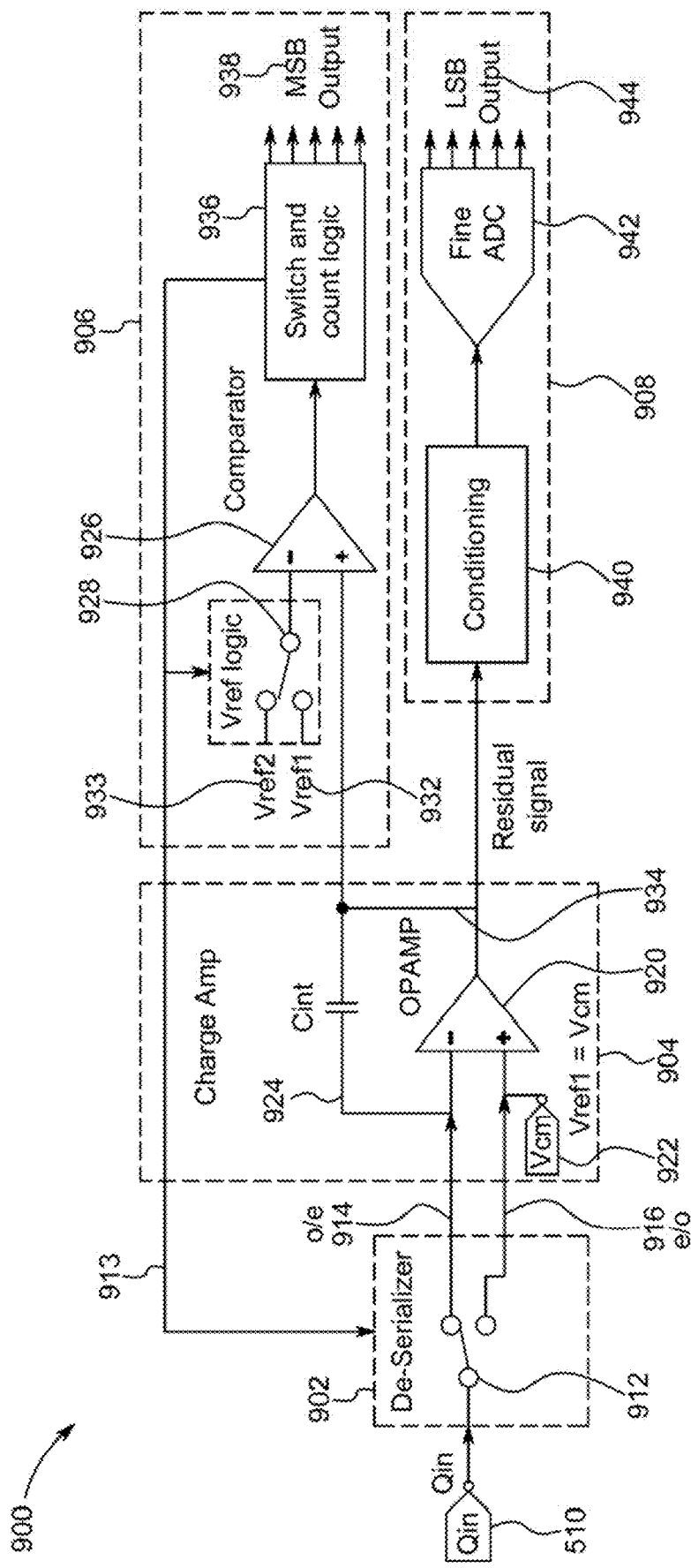
FIG. 9 shows a fingerprint capture apparatus according to another embodiment of the invention.

FIG. 9 shows a fingerprint capture apparatus 900 according to another embodiment of the invention and including a de-serializer 902, a charge amplifier 904, an MSB evaluator 906, and a LSB evaluator 908. The de-serializer 902 includes a switch 912 to produce streams o/e 914 and e/o 916 under the control of a switch control signal 913 output by the MSB evaluator 906. The charge amplifier 904 includes an operational amplifier 920 having a non-inverting input that receives signal 916 when switch 912 drives that signal, or receives Vcm 922 when the switch 912 is driving the o/e 914 signal. The inverting input of the operational amplifier 920 receives the o/e 914 signal. An accumulation capacitor Cint 924 is connected between the inverting input and output of the operational amplifier 920, without any reset switch being arranged in parallel to the capacitor.

The MSB evaluator 906 includes a switch 928 controlled by switch control signal 913 to select between connecting Vref2 933 or Vref1 932 to the inverting input of comparator 926. The non-inverting input of the comparator 926 is connected to the output 934 of the operational amplifier 920. Switch and count logic 936 receives the output of the comparator, counts a number of times that the output of the operational amplifier 920 exceeds either Vref1 or Vref2, and generates an output on the switch control signal 913 each time one of those thresholds is exceeded. The counter is reset after each integration time [t0, t2] is completed. Furthermore, the counter can be reset during [t1,t2] because by that time period the MSB read has been completed. The LSB evaluator 908 operates in a similar fashion to the LSB evaluator 508 in FIG. 5.

Figure 10:
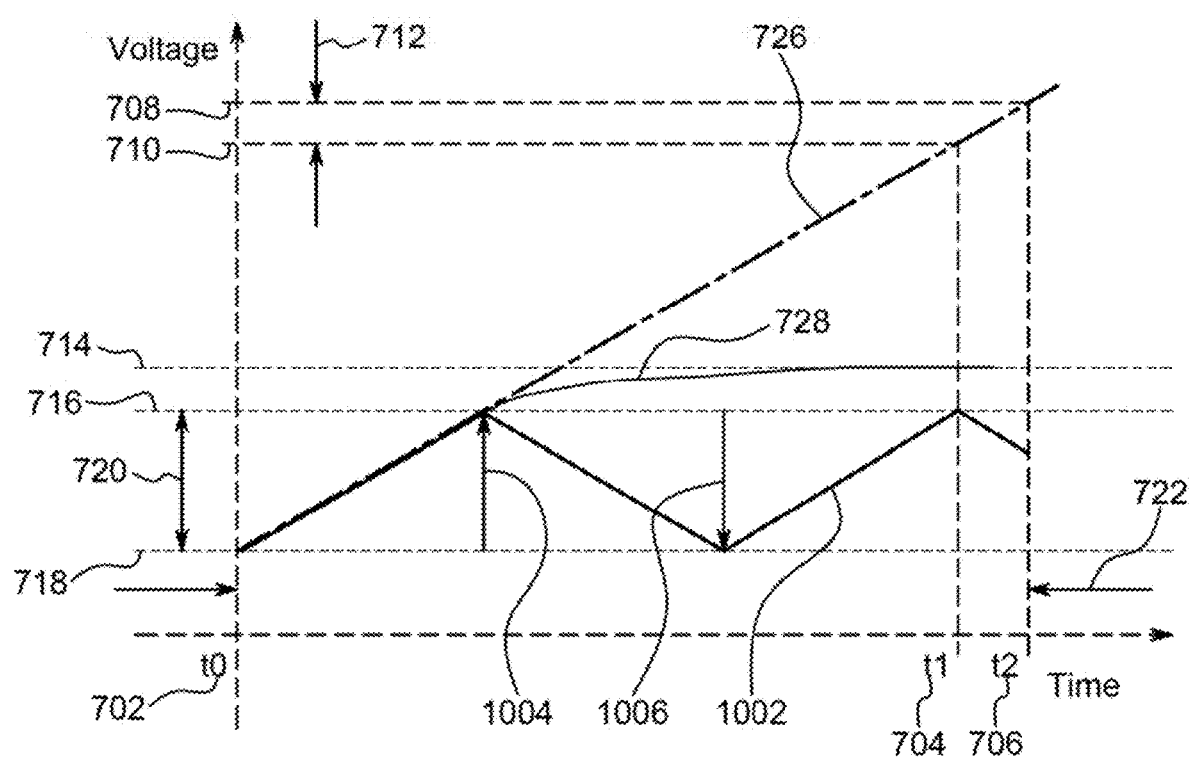
FIG. 10 shows timing of signals according to a method of operating the embodiment of the fingerprint capture apparatus.

FIG. 10 illustrates operation of the embodiment in FIG. 9, also referred to as the integrate-switch-delta embodiment, as discussed below. As with the embodiment of FIG. 5, the output of the charge amplifier is constrained to remain within the linear range of the de-serialized amplifier circuit 552 (or in alternative embodiments, the operational amplifier 920, the charge amplifier 904, or other combinations of circuits shown in FIG. 9 and/or FIG. 5A). However, where the embodiment of FIG. 5 would count the number of times the output reaches Vref2 716, and then reset the voltage in the integration capacitor Cint, the embodiment of FIG. 9 instead changes the direction of charging the Cint capacitor (i.e., changes between charging and discharging) each time the output of the charge amplifier reaches either one of the thresholds Vref1 718 and Vref2 716, and counts the number of times of that threshold occurrence. Thus, as shown in the example of FIG. 10, the voltage of the charge amplifier 1002 initially increases after time t0 until reaching Vref2 716. At that time, the MSB evaluator 938 increments the MSB output 938, generates control signal 913 which changes polarity of switch 912 in the de-serializer 902, and also changes polarity of switch 928 in the MSB evaluator 906 causing a charge direction switch 1004. Subsequently, additional detected charge Qrx causes the charge in the integration capacitor Cint to decrease by a corresponding amount until the charge amplifier output voltage 1002 reaches Vref1 718 resulting in a count increment of the MSB output 928, control signal 913, which changes polarity of switches 912 and 928, and a charge direction switch 1006. Subsequently, additional detected charge Qrx causes the charge in the integration capacitor Cint to again increase. The cycle of charge increase/decrease repeats until the end of integration time t2 706. The LSB evaluator indicates the residual voltage 712, as in the embodiment of FIG. 5.

The integrate-switch-delta embodiment of FIG. 9 may have the following advantages over the integrate-reset-delta embodiment of FIG. 5: (1) requires fewer circuit components for implementation, resulting in more compact, reliable, and cost effective design, and (2) may avoid large transients that could be associated with resetting (i.e., zeroing) the voltage on the integration capacitor Cint.

Figure 11:
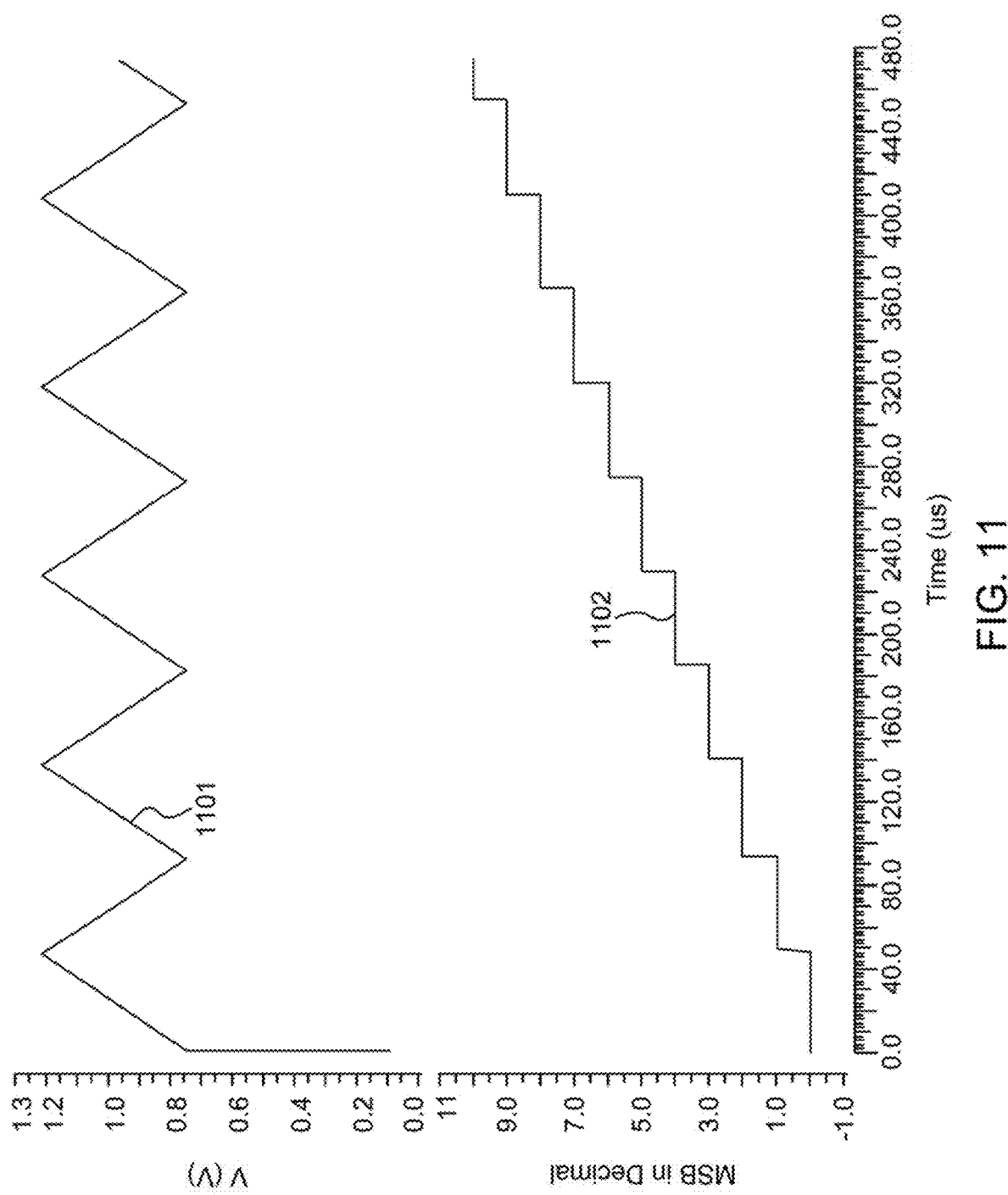
FIG. 11 shows timing of signals according to a method of operating the embodiment of the fingerprint capture apparatus.

FIG. 11 shows an example of operation of the embodiment of apparatus 900 in FIG. 9 in which the MSB read 1102 increases with the counts of the switch times of the CA output voltage 1101. The operation parameters are the same as in FIG. 8. However, the CA output voltage 1101 switches its integrate direction every time it reaches Vref1 and Vref2, instead of reset at Vref2 to Vref1 as in FIG. 8. The MSB read 1102 shows the same values along time as in MSB read 802.

Figure 12:
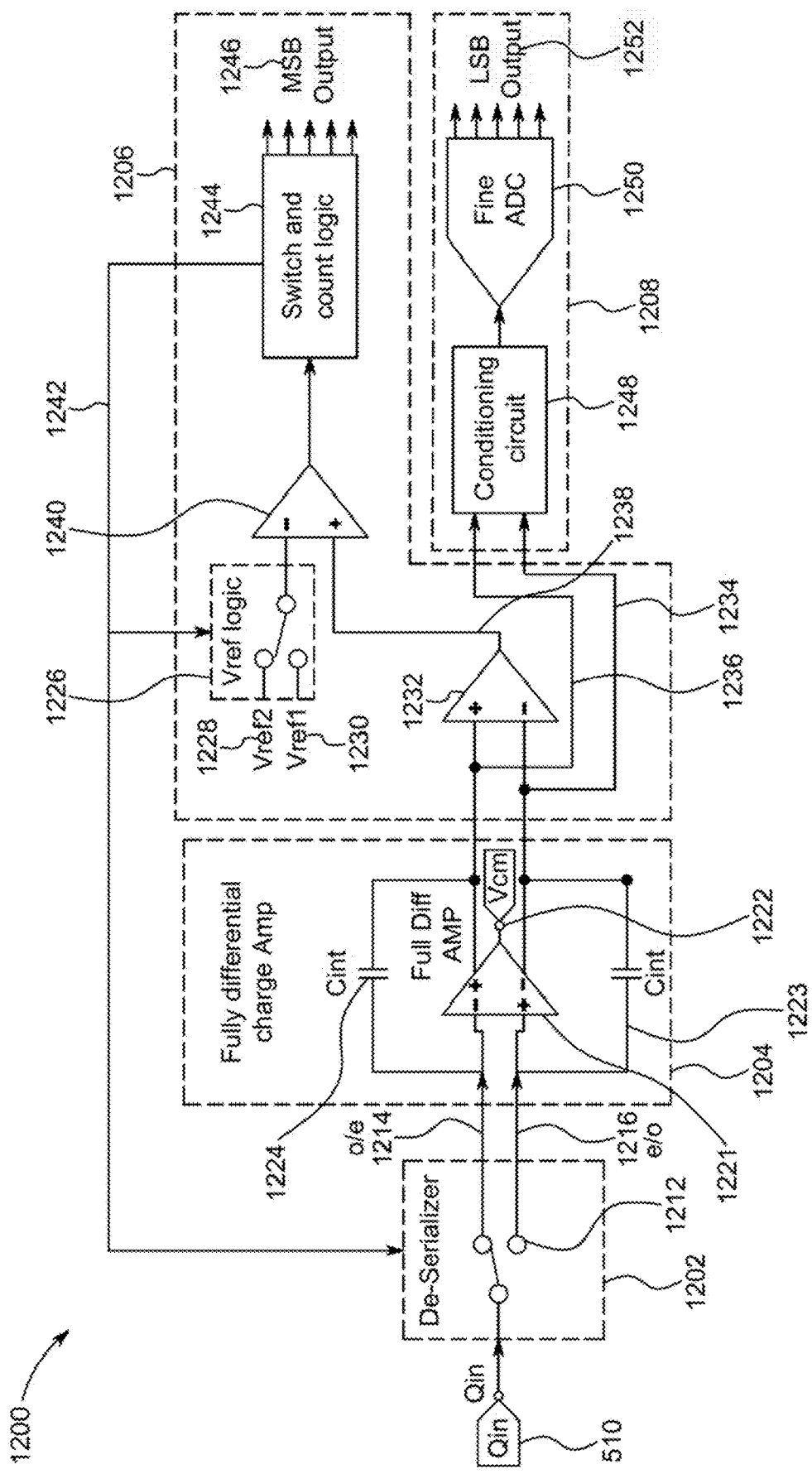
FIG. 12 a fingerprint capture apparatus according to another embodiment of the invention.

FIG. 12 shows a fingerprint capture apparatus 1200 according to another embodiment of the invention and including a de-serializer 1202, a fully differential charge amplifier 1204, an MSB evaluator 1206, and an LSB evaluator 1208. The de-serializer 1202 includes a switch 1212 to produce streams o/e 1214 and e/o 1216 under the control of a switch control signal 1242 output by the MSB evaluator 1206, as in the embodiment of FIG. 9. The fully differential charge amplifier 1204 includes a differential amplifier 1221 has a non-inverting input that receives e/o 1216 and in inverting input that receives o/e 1214. A first integration capacitor Cint 1223 connected between the non-inverting input and the inverting output of the differential amplifier 1221. A second integration capacitor Cint 1224 is connected between the inverting input and the non-inverting output of the differential amplifier 1221.

The MSB evaluator 1206 includes a first comparator 1232 having an inverting input that receives the inverting output of the differential amplifier 1221, and a non-inverting input that receives the non-inverting output of the differential amplifier 1221. The MSB evaluator 1206 includes a second comparator 1240 having a non-inverting input that receives an output from the first comparator 1232, and an inverting input that receives one of Vref1 1230 and Vref2 1228 under control of switch 1226 based on switch control signal 1242. Switch and control logic 1244 counts the number of times the output of the second comparator 1240 indicates that output of the differential amplifier reaches either Vref1 1230 or Vref2 1228, generates switch control signal 1242 and outputs the count as the MSB output 1246. LSB evaluator 1208 receives the differential outputs of the charge amplifier 1204, performs differential signal conditioning in conditioning circuit 1248, and converts the conditioned differential signal to digital with the Fine ADC 1250 to output the LSB output 1252.

The embodiment of FIG. 12 can achieve finer MSB reading or faster read-out time compared to either of the embodiments in FIGS. 5B and 9 which include single-ended implementations. This is because both e and o streams are integrated compared with embodiments in FIG. 5 and FIG. 9 where only e or o stream is integrated by the CA. Further, fully differential implementation rejects most of the common-mode noise in the data path and can achieve better SNR.

Figure 13:
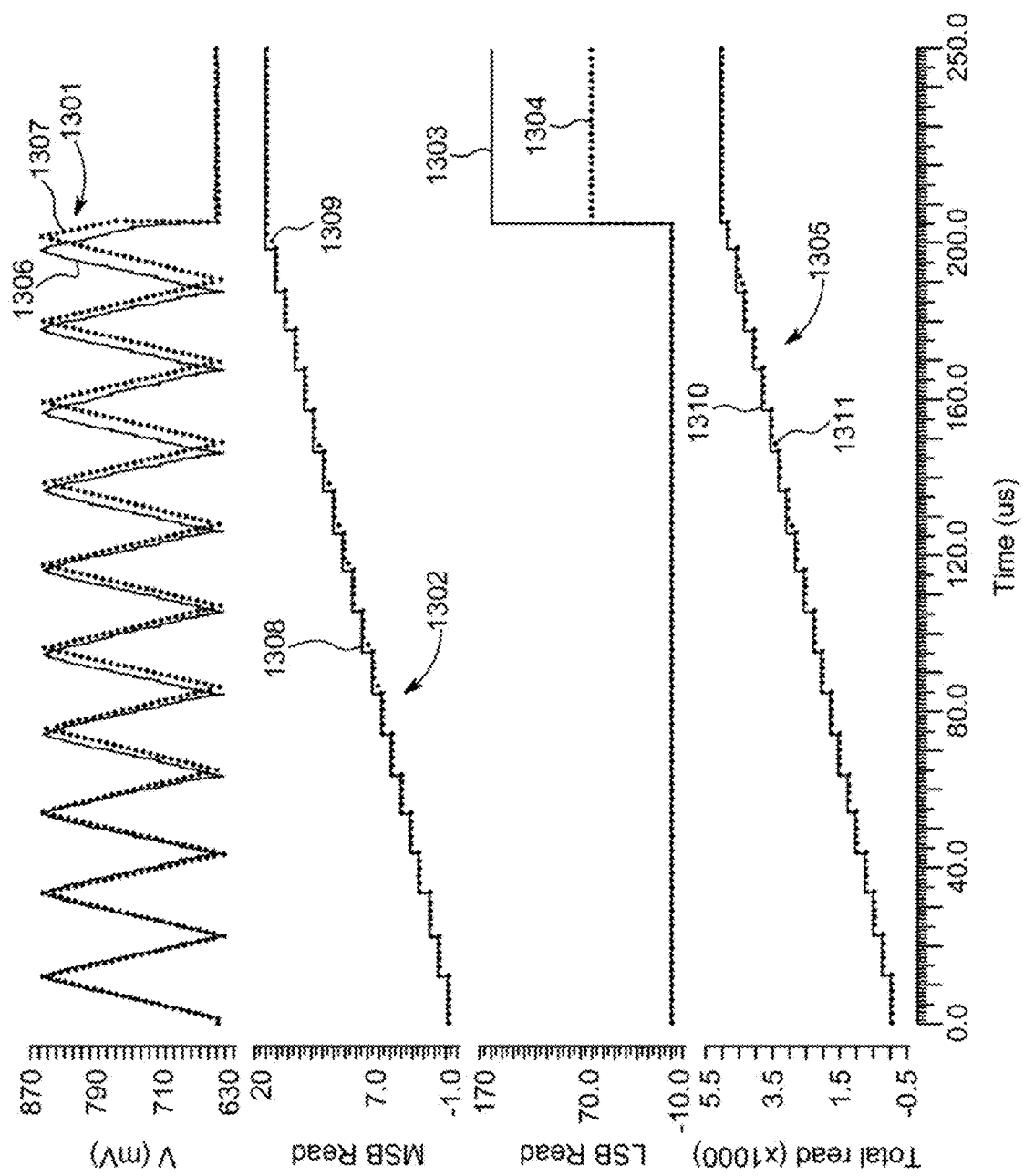
FIG. 13 timing of signals according to a method of operating the embodiment of the fingerprint capture apparatus.

FIG. 13 shows an example of operating the fully differential integrate-switch-delta embodiment of FIG. 12. In this example, there is a 5 aF FPS (ridge-valley difference). The solid lines and the dotted lines correspond to the ridge signals and valley signals, respectively. First, charge amplifier signals 1301 increase and decrease according to when they reach Vref1 or Vref2. At each switch point (Vref1 or Vref2), MSB read-out 1302 increases by one. In this example, the power supply voltage is 1.5V, Vref1=650 mV, and Vref2=850 mV. Both MSB and MLB are 8-bit binary numbers. Because of the 5 aF ridge-valley difference, CA signals 1301 gradually split (solid line 1306 for the ridge amplified signal and the dotted line 1307 for the valley amplified signal), causing a slight split of MSB read waveform 1302 for the ridge component 1308 and the valley component 1309 too. After approximately 205 us read time, the fine ADC is activated, giving an MLB read 1303 which has the value of 159 (decimal) for the ridge, and an MLB read 1304 which has the value of 69 (decimal) for the valley. In this example, MSB reads for the ridge and the valley are both 19 (decimal). The total reads 1305 (MSB+MLB) are 5023 (decimal) for the ridge 1310 and 4933 (decimal) for the valley 1311, after factoring in the scale between MSB and MLB. This yields a final FPS count of 90 (5023−4933=90), which is equivalent to 16 counts per aF.

Figure 14:
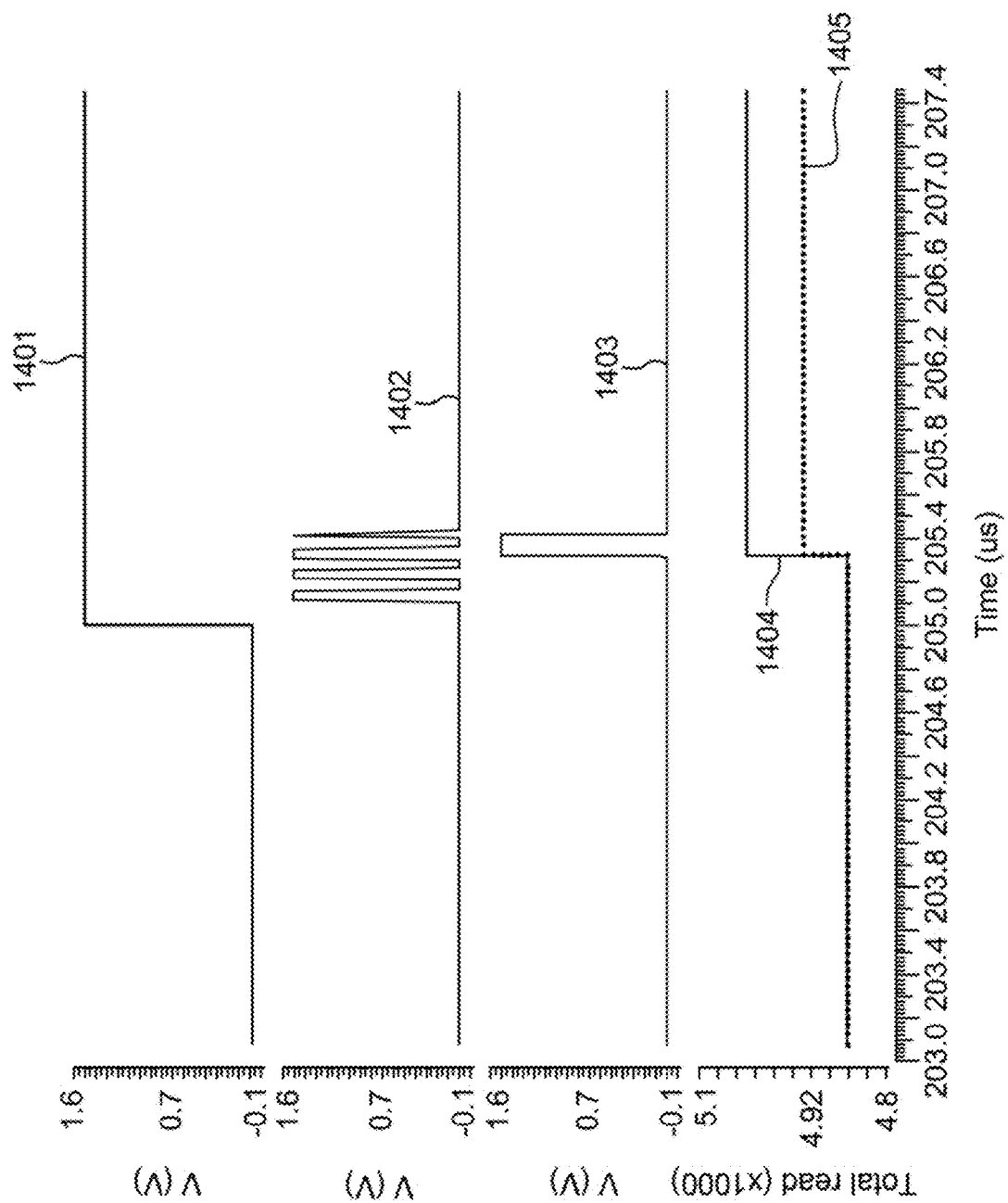
FIG. 14 timing of signals according to a method of operating the embodiment of the fingerprint capture apparatus.

FIG. 14 shows a further example of operation of the fully differential integrate-switch-delta embodiment of FIG. 12. In particular, signals 1401-1405 show the detailed read timing pertaining to FIG. 13. At t=205 us, the MLB command 1401 is issued by the host which activates the Fine ADC. In this example, the fine ADC is a "flash" or "one-shot" ADC. After 3 clock cycles (waveform 1402), the fine ADC completes the conversion. Then, the final read command 1403 is launched to latch the final counts into memory. Total read valley 1404 and total read ridge 1405 are also portrayed.

Figure 15:
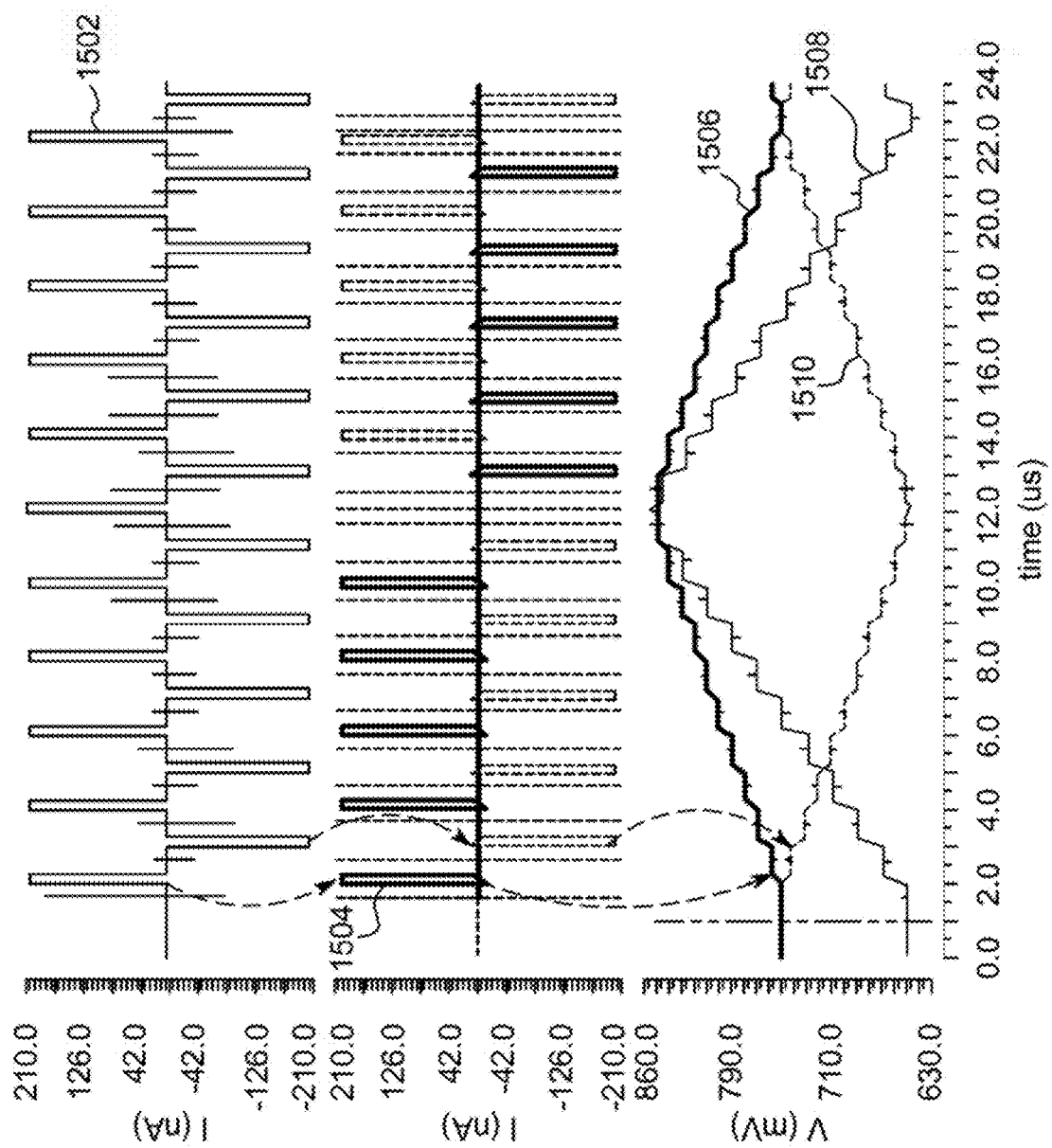
FIG. 15 timing of signals according to a method of operating the embodiment of the fingerprint capture apparatus.

FIG. 15 shows a further example of operation of the fully differential integrate-switch-delta embodiment of FIG. 12. In particular, signal 1502 represents the bi-polar input charge pulses, signal 1504 represents the charge pulses after the de-serializer, with the bold pulses being ones to be integrated onto one of the integration capacitors (corresponding to output signal 1506) and the lighter lined pulses being ones to be integrated onto the other integration capacitor (corresponding to output signal 1510). Signal 1506 shows voutp (positive branch), signal 1510 shows voutn (negative branch), and signal 1508 shows the difference vout=voutp−voutn.

Advantageously, embodiments of the invention may perform charge accumulation over multiple pulses or charge packets entirely in the analog domain (i.e., prior to converting the charge value to a digital signal). By performing accumulation early in the signal change, disadvantages associated with high dynamic range requirements may be minimized or avoided. According to embodiments, charge is accumulated by a component within the charge amplifier (e.g., a capacitor in the feedback path) that is reset (i.e., set to zero volts) or switched (i.e., having a changed operating mode) based on a voltage level of an output of the charge amplifier. Further, the voltage accumulation in the component of the charge amplifier depends on a resent status of the charge amplifier (i.e., whether the charge is accumulated by increasing a charge value or decreasing a charge value in the capacitor depends on whether the output of the charge amplifier most recently reached a first (upper) or second (lower) predetermined, fixed voltage threshold. Further, the amount of accumulated charge depends, in part, on a count of a number of time the component in the charge amplifier is reset or switched.

As used herein, an element or step recited in the singular and proceeded with the word "a" or "an" should be understood as not excluding plural elements or steps, unless such exclusion is explicitly recited. Furthermore, references to "one embodiment" of the present invention are not intended to be interpreted as excluding the existence of additional embodiments that also incorporate the recited features.

Control methods and systems described herein may be implemented using computer programming or engineering techniques including computer software, firmware, hardware or any combination or subset thereof, wherein the technical effects may include at least processing of the three-dimensional volumetric data and diagnostic metrics according to the present disclosure.

Figure 16:
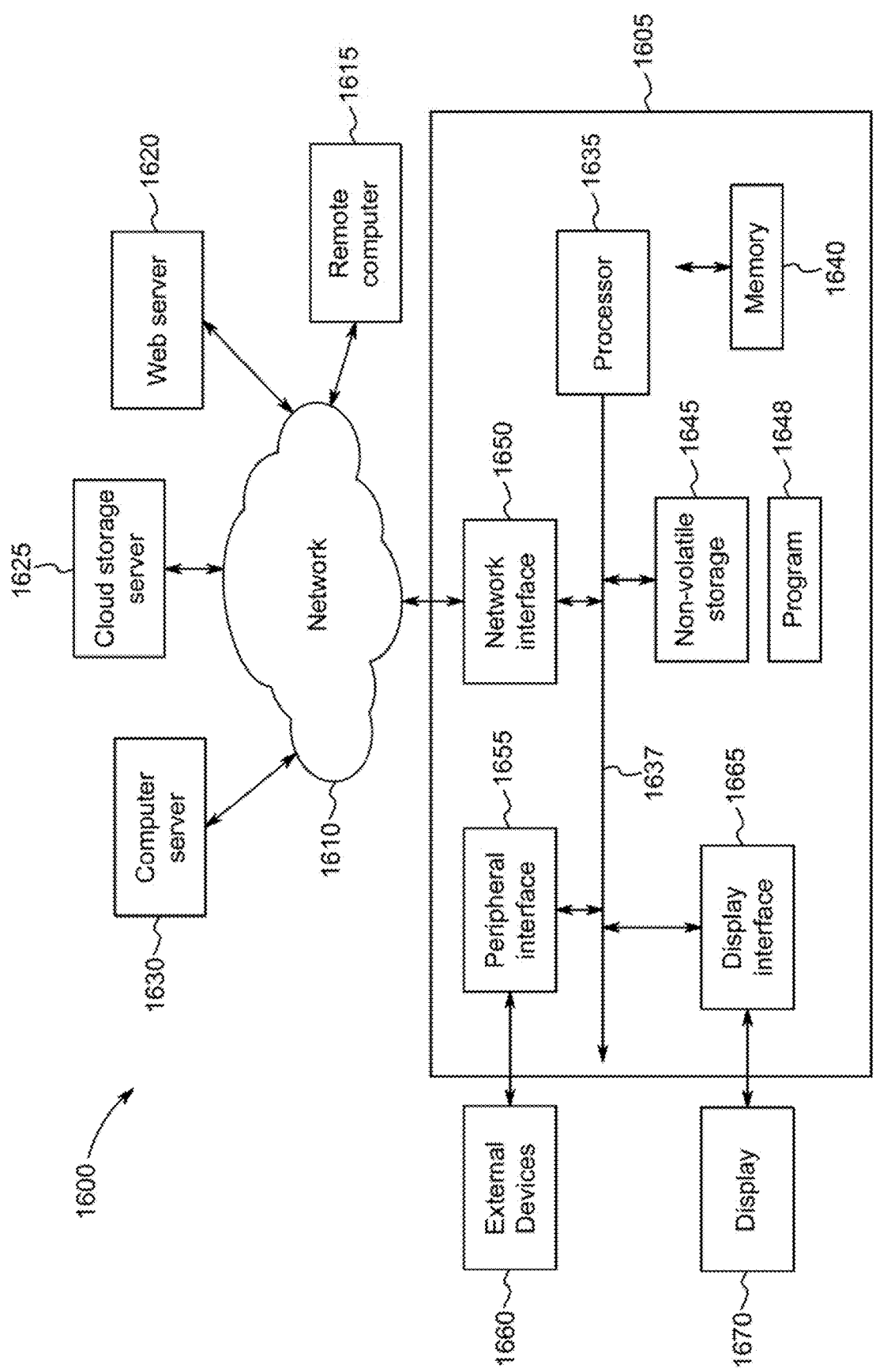
FIG. 16 shows a computer and related circuitry that may implement portions of embodiments of the fingerprint capture apparatus.

FIG. 16 illustrates a block diagram of a computer or related circuitry that may implement at least portions of the various embodiments described herein, such as the DSP/AI engine 136, the Host 138, and fingerprint detection processor 558. Control aspects of the present disclosure may be embodied as a system, a method, and/or a computer program product. The computer program product may include a computer readable storage medium on which computer readable program instructions are recorded that may cause one or more processors to carry out aspects of the embodiment.

The computer readable storage medium may be a tangible and non-transitory device that can store instructions for use by an instruction execution device (processor). The computer readable storage medium may be, for example, but is not limited to, an electronic storage device, a magnetic storage device, an optical storage device, an electromagnetic storage device, a semiconductor storage device, or any appropriate combination of these devices. A non-exhaustive list of more specific examples of the computer readable storage medium includes each of the following (and appropriate combinations): flexible disk, hard disk, solid-state drive (SSD), random access memory (RANI), read-only memory (ROM), erasable programmable read-only memory (EPROM or Flash), static random access memory (SRAM), compact disc (CD or CD-ROM), digital versatile disk (DVD), MO, and memory card or stick. A computer readable storage medium, as used in this disclosure, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions implementing the functions described in this disclosure can be downloaded to an appropriate computing or processing device from a computer readable storage medium or to an external computer or external storage device via a global network (i.e., the Internet), a local area network, a wide area network and/or a wireless network. The network may include copper transmission wires, optical communication fibers, wireless transmission, routers, firewalls, switches, gateway computers and/or edge servers. A network adapter card or network interface in each computing or processing device may receive computer readable program instructions from the network and forward the computer readable program instructions for storage in a computer readable storage medium within the computing or processing device.

Computer readable program instructions for carrying out operations of the present disclosure may include machine language instructions and/or microcode, which may be compiled or interpreted from source code written in any combination of one or more programming languages, including assembly language, Basic, Fortran, Java, Python, R, C, C++, C# or similar programming languages. The computer readable program instructions may execute entirely on a user's personal computer, notebook computer, tablet, or smartphone, entirely on a remote computer or computer server, or any combination of these computing devices. The remote computer or computer server may be connected to the user's device or devices through a computer network, including a local area network or a wide area network, or a global network (i.e., the Internet). In some embodiments, electronic circuitry including, for example, programmable logic circuitry, field-programmable gate arrays (FPGA), or programmable logic arrays (PLA) may execute the computer readable program instructions by using information from the computer readable program instructions to configure or customize the electronic circuitry, in order to perform aspects of the present disclosure.

Aspects of the present disclosure are described herein with reference to flow diagrams and block diagrams of methods, apparatus (systems), and computer program products according to embodiments of the disclosure. It will be understood by those skilled in the art that each block of the flow diagrams and block diagrams, and combinations of blocks in the flow diagrams and block diagrams, can be implemented by computer readable program instructions.

The computer readable program instructions that may implement the systems and methods described in this disclosure may be provided to one or more processors (and/or one or more cores within a processor) of a general purpose computer, special purpose computer, or other programmable apparatus to produce a machine, such that the instructions, which execute via the processor of the computer or other programmable apparatus, create a system for implementing the functions specified in the flow diagrams and block diagrams in the present disclosure. These computer readable program instructions may also be stored in a computer readable storage medium that can direct a computer, a programmable apparatus, and/or other devices to function in a particular manner, such that the computer readable storage medium having stored instructions is an article of manufacture including instructions which implement aspects of the functions specified in the flow diagrams and block diagrams in the present disclosure.

The computer readable program instructions may also be loaded onto a computer, other programmable apparatus, or other device to cause a series of operational steps to be performed on the computer, other programmable apparatus or other device to produce a computer implemented process, such that the instructions which execute on the computer, other programmable apparatus, or other device implement the functions specified in the flow diagrams and block diagrams in the present disclosure.

FIG. 16 is a functional block diagram illustrating a networked system 1600 of one or more networked computers and servers. In an embodiment, the hardware and software environment illustrated in FIG. 16 may provide an exemplary platform for implementation of the software and/or methods according to the present disclosure. Referring to FIG. 16, a networked system 1600 may include, but is not limited to, computer 1605, network 1610, remote computer 1615, web server 1620, cloud storage server 1625 and computer server 1630. In some embodiments, multiple instances of one or more of the functional blocks illustrated in FIG. 16 may be employed.

Additional detail of a computer 1605 is also shown in FIG. 16. The functional blocks illustrated within computer 1605 are provided only to establish exemplary functionality and are not intended to be exhaustive. And while details are not provided for remote computer 1615, web server 1620, cloud storage server 1625 and computer server 1630, these other computers and devices may include similar functionality to that shown for computer 1605. Computer 1605 may be a personal computer (PC), a desktop computer, laptop computer, tablet computer, netbook computer, a personal digital assistant (PDA), a smart phone, or any other programmable electronic device capable of communicating with other devices on network 1610.

Computer 1605 may include processor 1635, bus 1637, memory 1640, non-volatile storage 1645, network interface 1650, peripheral interface 1655 and display interface 1665. Each of these functions may be implemented, in some embodiments, as individual electronic subsystems (integrated circuit chip or combination of chips and associated devices), or, in other embodiments, some combination of functions may be implemented on a single chip (sometimes called a system on chip or SoC).

Processor 1635 may be one or more single or multi-chip microprocessors, such as those designed and/or manufactured by Intel Corporation, Advanced Micro Devices, Inc. (AMD), Arm Holdings (Arm), Apple Computer, etc. Examples of microprocessors include Celeron, Pentium, Core i3, Core i5 and Core i7 from Intel Corporation; Opteron, Phenom, Athlon, Turion and Ryzen from AMD; and Cortex-A, Cortex-R and Cortex-M from Arm. Bus 1637 may be a proprietary or industry standard high-speed parallel or serial peripheral interconnect bus, such as ISA, PCI, PCI Express (PCI-e), AGP, and the like.

Memory 1640 and non-volatile storage 1645 may be computer-readable storage media. Memory 1640 may include any suitable volatile storage devices such as Dynamic Random Access Memory (DRAM) and Static Random Access Memory (SRAM). Non-volatile storage 1645 may include one or more of the following: flexible disk, hard disk, solid-state drive (SSD), read-only memory (ROM), erasable programmable read-only memory (EPROM or Flash), compact disc (CD or CD-ROM), digital versatile disk (DVD) and memory card or stick.

Program 1648 may be a collection of machine readable instructions and/or data that is stored in non-volatile storage 1645 and is used to create, manage and control certain software functions that are discussed in detail elsewhere in the present disclosure and illustrated in the drawings. In some embodiments, memory 1640 may be considerably faster than non-volatile storage 1645. In such embodiments, program 1648 may be transferred from non-volatile storage 1645 to memory 1640 prior to execution by processor 1635.

Computer 1605 may be capable of communicating and interacting with other computers via network 1610 through network interface 1650. Network 1610 may be, for example, a local area network (LAN), a wide area network (WAN) such as the Internet, or a combination of the two, and may include wired, wireless, or fiber optic connections. In general, network 1610 can be any combination of connections and protocols that support communications between two or more computers and related devices.

Peripheral interface 1655 may allow for input and output of data with other devices that may be connected locally with computer 1605. For example, peripheral interface 1655 may provide a connection to external devices 1660. External devices 1660 may include devices such as a keyboard, a mouse, a keypad, a touch screen, and/or other suitable input devices. External devices 1660 may also include portable computer-readable storage media such as, for example, thumb drives, portable optical or magnetic disks, and memory cards. Software and data used to practice embodiments of the present disclosure, for example, program 1648, may be stored on such portable computer-readable storage media. In such embodiments, software may be loaded onto non-volatile storage 1645 or, alternatively, directly into memory 1640 via peripheral interface 1655. Peripheral interface 1655 may use an industry standard connection, such as RS-232 or Universal Serial Bus (USB), to connect with external devices 1660.

Display interface 1665 may connect computer 1605 to display 1670. Display 1670 may be used, in some embodiments, to present a command line or graphical user interface to a user of computer 1605. Display interface 1665 may connect to display 1670 using one or more proprietary or industry standard connections, such as VGA, DVI, DisplayPort and HDMI.

As described above, network interface 1650, provides for communications with other computing and storage systems or devices external to computer 1605. Software programs and data discussed herein may be downloaded from, for example, remote computer 1615, web server 1620, cloud storage server 1625 and computer server 1630 to non-volatile storage 1645 through network interface 1650 and network 1610. Furthermore, the systems and methods described in this disclosure may be executed by one or more computers connected to computer 1605 through network interface 1650 and network 1610. For example, in some embodiments the systems and methods described in this disclosure may be executed by remote computer 1615, computer server 1630, or a combination of the interconnected computers on network 1610.

Data, datasets and/or databases employed in embodiments of the systems and methods described in this disclosure may be stored and or downloaded from remote computer 1615, web server 1620, cloud storage server 1625 and computer server 1630.

Numerous modifications and variations of the present invention are possible in light of the above teachings. It is therefore to be understood that within the scope of the appended claims, the invention may be practiced otherwise than as specifically described herein.

What is claimed is:

1. A fingerprint capturing apparatus comprising:
   a plurality of panel capacitors each configured to output an alternating charge signal indicating a capacitance proportional to a proximity of a portion of a subject's finger;
   a de-serialized amplifier circuit including an operational amplifier that receives the alternating charge signal from the plurality of panel capacitors;
   a change in condition control circuit configured to make a change in an operating condition of the de-serialized amplifier based on a voltage of an output of the operational amplifier, and output a count of a number of times of making the change in the operating condition of the de-serialized amplifier; and
   a processor circuit configured to recognize a fingerprint of the subject's finger based on the count of the number of times of making the change in the operating condition of the de-serialized amplifier.

2. The fingerprint capturing apparatus according to claim 1, wherein:
   the de-serialized amplifier circuit includes a de-serializing switch configured to direct the alternating charge signal to one of an inverting and a non-inverting input of the operational amplifier; and
   the change in condition control circuit makes the change in the operating condition of the de-serialized amplifier by changing whether the de-serializing switch directs the alternating charge signal to the inverting input or the non-inverting input of the operational amplifier.

3. The fingerprint capturing apparatus according to claim 1, wherein:
the de-serialized amplifier circuit includes a charge amplifier circuit including the operational amplifier and an accumulation capacitor connected from an input of the operational amplifier to the output of the operational amplifier; and
the change in condition control circuit makes the change in the operating condition of the de-serialized amplifier by changing when a voltage stored on the accumulation capacitor is reset to zero.

4. The fingerprint capturing apparatus according to claim 1, wherein:
the change in condition control circuit includes a comparator circuit and a count circuit,
the comparator circuit receives an output voltage of the operational amplifier, and
the count circuit is configured to increment a stored count based on an output of the comparator circuit and output the stored count as the count of the number of times of making the change in the operating condition of the de-serialized amplifier circuit.

5. The fingerprint capturing apparatus according to claim 1, further comprising:
a fine analog-to-digital circuit configured to output a number corresponding to a detected residual of the voltage of the output of the operational amplifier, and
the processor circuit is further configured to recognize the fingerprint of the subject's finger based on the number corresponding to the detected residual of the voltage of the output of the operational amplifier.

6. The fingerprint capturing apparatus according to claim 5, wherein:
the fine analog-to-digital circuit includes a conditioning circuit that receives the output of the operational amplifier and outputs a differentially conditioned signal; and
the fine analog-to-digital circuit further includes an analog-to-digital converter configured to convert the differentially conditioned signal to the number corresponding to the detected residual voltage of the output of the operational amplifier.

7. The fingerprint capturing apparatus according to claim 6, wherein:
the processor circuit is further configured to concatenate the number corresponding to the detected residual of the voltage of the output of the operational amplifier, as a least significant part of a measurement of an accumulated voltage corresponding to the proximity of the portion of the subject's finger, and the number of times of making the change in the operating condition of the de-serialized amplifier, as a most significant part of the measurement of the accumulated voltage corresponding to the proximity of the portion of the subject's finger; and
the processor circuit is further configured to recognize the fingerprint of the subject's finger based on the measurement of the accumulated voltage corresponding to the proximity of the portion of the subject's finger.

8. The fingerprint capturing apparatus according to claim 1, wherein:
the change in condition control circuit is configured to make the change in the operating condition of the de-serialized amplifier to maintain the voltage of the output of the operational amplifier within a linear range of the de-serialized amplifier circuit.

9. The fingerprint capturing apparatus according to claim 1, wherein:
the de-serialized amplifier circuit includes a de-serializing switch configured to direct the alternating charge signal to one of an inverting and a non-inverting input of the operational amplifier, a first accumulation capacitor connected from the inverting input of the operational amplifier to a non-inverting output of the operational amplifier, and a second accumulation capacitor connected from the non-inverting input of the operational amplifier to an inverting output of the operational amplifier; and
the change in condition control circuit makes the change in the operating condition of the de-serialized amplifier by changing whether the de-serializing switch directs the received alternating voltage to the inverting input or the non-inverting input of the operational amplifier.

10. The fingerprint capturing apparatus according to claim 1, wherein:
the change in condition control circuit includes a comparator having a first input connected to the output of the operational amplifier; and
the change in condition control circuit further includes a switch and count logic that increments the count of the number of times of making the change in the operating condition of the de-serialized amplifier based on an output of the comparator.

11. The fingerprint capturing apparatus according to claim 10, wherein:
the comparator has a second input connected to a fixed max linear region reference voltage; and
the output of the comparator becomes active when a voltage at the first input of the comparator is greater than a voltage at the second input of the comparator.

12. The fingerprint capturing apparatus according to claim 10, wherein:
the change in condition control circuit further includes a reference logic switch configured to connect a second input of the comparator to one of a fixed max linear region reference voltage and a fixed min linear region reference voltage; and
the change in condition control circuit is further configured to change a position of the reference logic switch when making the change in the operating condition of the de-serialized amplifier.

13. The fingerprint capturing apparatus according to claim 1, wherein:
the processor circuit is further configured to obtain a digitized image of the fingerprint of the subject's finger based on the count of the number of times of making the change in the operating condition of the de-serialized amplifier for each of the plurality of panel capacitors.

14. A fingerprint capturing apparatus comprising:
a plurality of panel capacitors each configured to output an alternating charge signal indicating a capacitance proportional to a proximity of a portion of a subject's finger;
a de-serialized amplifier circuit including an operational amplifier that receives the alternating charge signal from the plurality of panel capacitors;
means for making a change in an operating condition of the de-serialized amplifier based on a voltage of an output of the operational amplifier, and outputting a count of a number of times of making the change in the operating condition of the de-serialized amplifier; and
a processor circuit configured to recognize a fingerprint of the subject's finger based on the count of the number of times of making the change in the operating condition of the de-serialized amplifier.

15. A method of capturing a fingerprint comprising:

outputting, from a plurality of panel capacitors, an alternating charge signal indicating a capacitance proportional to a proximity of a portion of a subject's finger;

receiving, by a de-serialized amplifier circuit including an operational amplifier, the alternating charge signal;

making a change in an operating condition of the de-serialized amplifier based on a voltage of an output of the operational amplifier;

outputting a count of a number of times of making the change in the operating condition of the de-serialized amplifier; and recognizing a fingerprint of the subject's finger based on the count of the number of times of making the change in the operating condition of the de-serialized amplifier.

16. The method of capturing the fingerprint according to claim 15 further comprising:

directing the alternating charge signal to one of an inverting and a non-inverting input of the operational amplifier; and the making the change in the operating condition of the de-serialized amplifier by changing whether the directing is directing the alternating charge signal to the inverting input or the non-inverting input of the operational amplifier.

17. The method of capturing the fingerprint according to claim 15 further comprising:

making the change in the operating condition of the de-serialized amplifier by changing when a voltage stored on an accumulation capacitor connected from an input to an output of an operational amplifier in the de-serialized amplifier is reset to zero.

18. The method of capturing the fingerprint according to claim 15 further comprising:

incrementing a stored count when an output voltage of the operational amplifier reaches a threshold voltage; and outputting the stored count as the count of the number of times of making the change in the operating condition of the de-serialized amplifier circuit.

19. The method of capturing the fingerprint according to claim 15 further comprising:

outputting a number corresponding to a detected residual of the voltage of the output of the operational amplifier; and recognizing the fingerprint of the subject's finger based on the number corresponding to the detected residual of the voltage of the output of the operational amplifier.

20. The method of capturing the fingerprint according to claim 15 further comprising:

making the change in the operating condition of the de-serialized amplifier to maintain the voltage of the output of the operational amplifier within a linear range of the de-serialized amplifier circuit.

* * * * *